US012756314B2

(12) United States Patent
Huang et al.

(10) Patent No.: US 12,756,314 B2
(45) Date of Patent: Oct. 6, 2026

(54) DRIVING CIRCUIT, VOLTAGE CONVERTER AND CONTROL METHOD THEREOF

(71) Applicant: PowerX Semiconductor Corporation, Hsinchu County (TW)

(72) Inventors: Tsung Wei Huang, Hsinchu County (TW); Chia-Hung Tsen, Hsinchu County (TW)

(73) Assignee: PowerX Semiconductor Corporation, Hsinchu County (TW)

( * ) Notice: Subject to any disclaimer, the term of this patent is extended or adjusted under 35 U.S.C. 154(b) by 113 days.

(21) Appl. No.: 19/015,679

(22) Filed: Jan. 10, 2025

(65) Prior Publication Data

US 2026/0095099 A1 Apr. 2, 2026

(30) Foreign Application Priority Data

Sep. 27, 2024 (TW) ................................ 113137168

(51) Int. Cl.

*H02M 3/158* (2006.01)
*H02M 1/088* (2006.01)
*H02M 3/157* (2006.01)
*H03K 17/284* (2006.01)

(Continued)

(52) U.S. Cl.

CPC ........... *H02M 3/158* (2013.01); *H02M 1/088* (2013.01); *H02M 3/157* (2013.01); *H03K 17/284* (2013.01); *H03K 2017/0806* (2013.01); *H03K 17/08122* (2013.01)

(58) Field of Classification Search

CPC ...... H02M 3/158; H02M 1/088; H02M 3/157; H03K 17/284; H03K 17/08122; H03K 2017/0806

See application file for complete search history.

(56) References Cited

U.S. PATENT DOCUMENTS 5,689,460 A * 11/1997 Ooishi .................. G11C 5/143 327/535
6,633,195 B2 10/2003 Baudelot et al.
11,245,392 B1 * 2/2022 Hsia .................... H03K 17/166

(Continued)

FOREIGN PATENT DOCUMENTS

CN 1296289 A 5/2001
CN 102201734 A 9/2011

(Continued)

*Primary Examiner* — Rafael O De Leon Domenech

(74) *Attorney, Agent, or Firm* — CKC & Partners Co., LLC

(57) ABSTRACT

A driving circuit is provided for providing first and second control signals to respective control electrode of first and second power semiconductor elements coupled in parallel. A range of a safe operation area (SOA) of the first power semiconductor element is larger than that of the second power semiconductor element. The driving circuit compares a voltage level of the second control signal with a first reference voltage or compares a drain-source voltage of the first power semiconductor element with a second reference voltage, and further generates a first voltage according to the comparison result. The first and second reference voltages are related to a temperature of the first and second power semiconductor elements. The driving circuit generates a logic signal according to the first voltage and further generates the first or second control signal according to the logic signal.

20 Claims, 14 Drawing Sheets

(51) Int. Cl.
*H03K 17/08* (2006.01)
*H03K 17/0812* (2006.01)

(56) References Cited

U.S. PATENT DOCUMENTS

| | | | | | |
|---|---|---|---|---|---|
| 2003/0160649 | A1 | 8/2003 | Nakai | | |
| 2012/0249020 | A1* | 10/2012 | Komatsu | H02M 1/32 | 327/109 |
| 2014/0375362 | A1* | 12/2014 | Lobsiger | H03K 17/168 | 327/109 |
| 2015/0171852 | A1* | 6/2015 | Pang | H03K 17/08104 | 327/109 |
| 2019/0140635 | A1 | 5/2019 | Abesingha et al. | | |

FOREIGN PATENT DOCUMENTS

| | | | |
|---|---|---|---|
| CN | 108322034 | A | 7/2018 |
| CN | 114640328 | A | 6/2022 |
| CN | 115118133 | A | 9/2022 |
| CN | 117895755 | A | 4/2024 |
| JP | H11205122 | A | 7/1999 |
| JP | 2002369497 | A | 12/2002 |
| JP | 2008283827 | A | 11/2008 |
| JP | 2016092907 | A | 5/2016 |
| TW | 201304411 | A | 1/2013 |
| TW | I779495 | B | 10/2022 |
| TW | 202349020 | A | 12/2023 |
| TW | M667641 | U | 3/2025 |
| WO | 2016189804 | A1 | 12/2016 |
| WO | 2022085495 | A1 | 4/2022 |

* cited by examiner

DRIVING CIRCUIT, VOLTAGE CONVERTER AND CONTROL METHOD THEREOF

CROSS-REFERENCE TO RELATED APPLICATION

This application claims priority to Taiwan Application Serial Number 113137168, filed Sep. 27, 2024, which is herein incorporated by reference in its entirety.

BACKGROUND

Technical Field

The present invention relates to a voltage converter, and more particularly to a driving circuit, a voltage converter, and a control method thereof.

Description of Related Art

In order to realize a voltage converter with high-voltage withstanding capability, a conventional technology connects two power semiconductor elements of high-side and low-side portions in a cascode connection. However, the cascode connection increases the on-resistance, resulting in poor switching efficiency.

SUMMARY

An objective of the present invention is to provide a driving circuit, which is used for generating a first control signal and a second control signal and providing the first and second control signals respectively to control electrodes of first and second power semiconductor elements that are coupled to a voltage converter in parallel. A range of a safe operation area (SOA) of the first power semiconductor element is larger than a range of an SOA of the second power semiconductor element. The driving circuit includes a first time delay circuit, a control logic circuit and a first buffer. The first time delay circuit performs a first comparison operation to compare a voltage level of the second control signal with a first reference voltage to generate a first comparison result or compare a drain-source voltage of the first power semiconductor element with a second reference voltage to generate a second comparison result. The first time delay circuit generates a first voltage according to the first or second comparison result. The first and second reference voltages are related to a temperature of the first and second power semiconductor elements. The control logic circuit is coupled to the first time delay circuit and generates a first logic signal according to the first voltage, and the first buffer is coupled to the control logic circuit and generates one of the first and second control signals according to the first logic signal.

Another objective of the present invention is to provide a voltage converter, which includes: a first power semiconductor element, a second power semiconductor element, a first time delay circuit, a control logic circuit, and a first buffer. The first power semiconductor element has a control electrode for receiving a first control signal. The second power semiconductor element is connected in parallel to the first power semiconductor element, and has a control electrode for receiving a second control signal. A range of an SOA of the first power semiconductor element is larger than a range of an SOA of the second power semiconductor element. The first time delay circuit performs a first comparison operation to compare a voltage level of the second control signal with a first reference voltage to generate a first comparison result or compare a drain-source voltage of the first power semiconductor element with a second reference voltage to generate a corresponding second comparison result. The first time delay circuit generates a first voltage according to the first or second comparison result. The first and second reference voltages are related to the temperature of the first and second power semiconductor elements. The control logic circuit is coupled to the first time delay circuit and generates a first logic signal according to the first voltage and a pulse-width modulation (PWM) signal. The first buffer is coupled to the control logic circuit and generates one of the first and second control signals according to the first logic signal.

Still another objective of the present invention is to provide a control method of a voltage converter, which is used to generate a first control signal and a second control signal and provide them respectively to control electrodes of first and second power semiconductor elements that are coupled to the voltage converter in parallel. A range of an SOA of the first power semiconductor element is larger than a range of an SOA of the second power semiconductor element. The control method of the voltage converter includes: receiving a pulse-width modulation (PWM) signal; performing a first comparison operation to compare a voltage level of the second control signal with a first reference voltage to generate a first comparison result or compare a drain-source voltage of the first power semiconductor element with a second reference voltage to generate a second comparison result, where the first and second reference voltages are related to the temperature of the first and second power semiconductor elements; generating a first voltage according to the first or second comparison result; generating a first logic signal according to the first voltage; and buffering the first logic signal to generate one of the first and second control signals.

In order to make the above features and advantages of the present invention more obvious and easier to understand, the present invention is described in detail below by giving specific embodiments and with reference to the accompanying drawings.

BRIEF DESCRIPTION OF THE DRAWINGS

A better understanding of the status of the present invention can be gained from the following detailed description in conjunction with the accompanying drawings. It should be noted that, in accordance with standard industry practice, the features are not drawn to scale. In fact, the dimensions of the features can be increased or decreased at will for the sake of clarity of discussion.

DETAILED DESCRIPTION

Specific embodiments of the present invention are further described in detail below, however, the embodiments described are not intended to limit the present invention and it is not intended for the description of operation to limit the order of implementation. The using of "first", "second", "third", etc. in the specification should be understood for identify units or data described by the same terminology, but is not referred to particular order or sequence.

Figure 1:
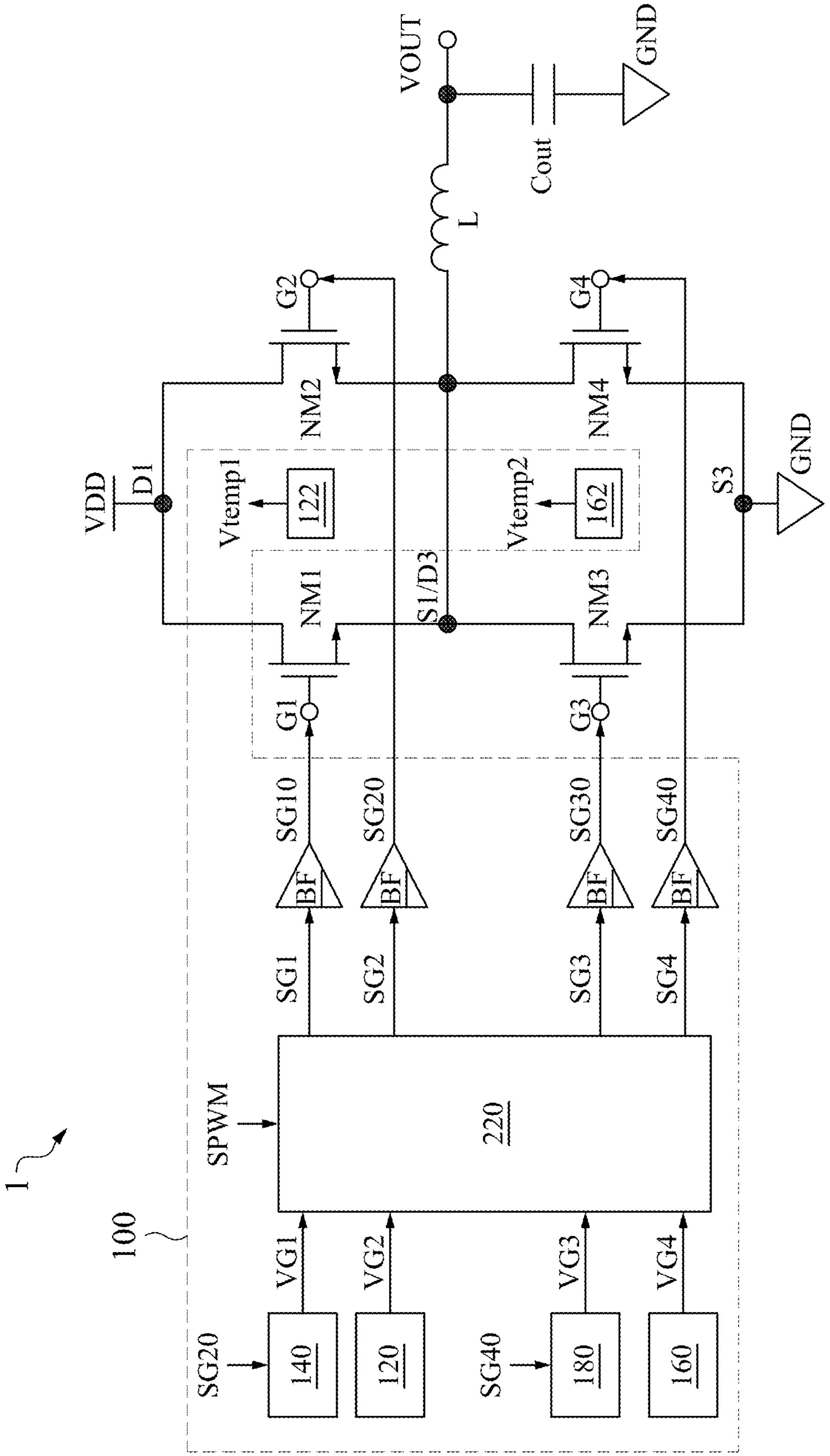
FIG. 1 is a circuit diagram of a voltage converter according to some embodiments of the present invention.

FIG. 1 is a circuit diagram of a voltage converter 1 according to some embodiments of the present invention. In the embodiment of FIG. 1, the voltage converter 1 is a buck converter. The voltage converter 1 includes temperature sensors 122 and 162, time delay circuits 120, 140, 160, and 180, a control logic circuit 220, buffers BF, power semiconductor elements NM1 to NM4, an inductor L, and an output capacitor Cout. The power semiconductor elements NM1 and NM2 constitute a high-side portion of the voltage converter 1, and the power semiconductor elements NM3 and NM4 constitute a low-side portion of the voltage converter 1.

The temperature sensor 122 is disposed in the proximity of the power semiconductor elements NM1 and NM2, so as to sense the temperature of the power semiconductor elements NM1 and NM2 (i.e., the temperature of the high-side portion) and output a sensing voltage Vtemp1 corresponding to the sensed temperature (i.e., the sensing voltage Vtemp1 indicates the temperature of the power semiconductor elements NM1 and NM2). In this embodiment, when the temperature of the power semiconductor elements NM1 and NM2 increases, the sensing voltage Vtemp1 increases. For example, different voltage values of the sensing voltage Vtemp1 should correspond to different temperature values or different temperature ranges of the power semiconductor elements NM1 and NM2. The temperature sensor 162 is disposed in the proximity to the power semiconductor elements NM3 and NM4, so as to sense the temperature of the power semiconductor elements NM3 and NM4 (i.e., the temperatures of the low-side portion) and output a sensing voltage Vtemp2 corresponding to the sensed temperature (i.e., the sensing voltage Vtemp2 indicates the temperatures of the power semiconductor elements NM3 and NM4). In this embodiment, when the temperature of the power semiconductor elements NM3 and NM4 increases, the sensing voltage Vtemp2 increases. For example, different voltage values of the sensing voltage Vtemp2 should correspond to different temperature values or temperature ranges of the power semiconductor elements NM3 and NM4.

The time delay circuits 140 and 120 are coupled to the temperature sensor 122 to receive the sensing voltage Vtemp1 from the temperature sensor 122 and further configured to provide or generate voltages VG1 and VG2, respectively, based on the sensing voltage Vtemp1. The time delay circuits 180 and 160 are coupled to the temperature sensor 162 to receive the sensing voltage Vtemp2 from the temperature sensor 162 and further configured to provide voltages VG3 and VG4, respectively, based on the sensing voltage Vtemp2. Based on the above description, the time delay circuits 140, 120, 180, and 160 operate to provide the voltages VG1, VG2, VG3, and VG4, respectively.

The control logic circuit 220 is configured to receive a PWM signal SPWM and coupled to the time delay circuits 120, 140, 160, and 180 to receive the voltages VG1, VG2, VG3, and VG4, respectively. As shown in FIG. 1, the control logic circuit 220 provides or generates logic signals SG1~SG4 according to the PWM signal SPWM and the voltages VG1~VG4. The buffers BF buffer the logic signals SG1~SG4 respectively. In detail, each of the logic signals SG1~SG4 is boosted by the corresponding buffer BF to enhance its signal strength (to boost its driving capability). The boosted logic signals SG1, SG2, SG3 and SG4 are used as control signals SG10, SG20, SG30 and SG40, respectively. In other words, the control signals SG10, SG20, SG30 and SG40 are obtained from the boosted logic signals SG1, SG2, SG3 and SG4 via the buffers BF, respectively (i.e., the control signals SG10, SG20, SG30 and SG40 are derived from the logic signals SG1, SG2 SG3 and SG4 respectively). The buffers BF provide the control signals SG10, SG20, SG30, and SG40 to the gate electrodes (also known as control electrodes) G1, G2, G3, and G4 of the power semiconductor elements NM1, NM2, NM3, and NM4, respectively, for controlling or determining the turned-on/turned-off (on/off) states of the power semiconductor elements NM1, NM2, NM3, and NM4 respectively. In the embodiment of FIG. 1, the temperature sensors 122 and 162, the time delay circuits 120, 140, 160, and 180, the buffers BF, and the control logic circuit 220 form a driving circuit 100 which provides or generates the control signals SG10, SG20, SG30, and SG40 for driving the power semiconductor elements NM1, NM2, NM3, and NM4 respectively. In other embodiments, the driving circuit 100 comprises the time delay circuits 120, 140, 160, and 180, the buffers BF, and the control logic circuit 220, while the temperature sensors 122 and 162 are disposed outside the driving circuit 100.

The PWM signal SPWM is a signal provided by a pre-stage circuit (not shown in FIG. 1), and can be switched or converted between a high voltage level and a low voltage level. The PWM signal SPWM that is switched or converted to the high voltage level instructs the voltage converter 1 to turn on the high-side portion (i.e., the power semiconductor elements NM1 and NM2), and in this case, the high-side portion charges the output capacitor Cout via the inductor L. The PWM signal SPWM that is switched or converted to a low voltage level instructs the voltage converter 1 to turn on the low-side portion (i.e., the power semiconductor elements NM3 and NM4), and, in this case, the low-side portion causes the output capacitor Cout to be discharged via the inductor L. By charging and discharging the output capacitor Cout, the voltage converter 1 generates an output voltage VOUT.

In the voltage converter 1, the power semiconductor element NM1 is connected in parallel to the power semiconductor element NM2, so that there are a common drain electrode D1 and a common source electrode S1 for the power semiconductor elements NM1 and NM2. In some embodiments of the present invention, a range of a safe operation area (SOA) of the power semiconductor element NM1 is larger than that of the power semiconductor element NM2, and therefore, the power semiconductor element NM1 has better high-voltage withstanding capability than the power semiconductor element NM2. In the embodiments of the present invention, the power semiconductor elements NM1 and NM2 are implemented by Metal-Oxide-Semiconductor Field-Effect Transistor (MOSFETs), but the present invention is not limited thereto.

In the voltage converter 1, the power semiconductor element NM3 is connected in parallel to the power semiconductor element NM4, so that there are a common drain electrode D3 and a common source electrode S3 for the power semiconductor elements NM3 and NM4. In the embodiments of the present invention, a range of the SOA of the power semiconductor element NM3 is larger than that of the power semiconductor element NM4, and therefore the power semiconductor element NM3 has better high-voltage withstanding capability than the power semiconductor element NM4. In the embodiments of the present invention, the power semiconductor elements NM3 and NM4 are implemented by MOSFETs, but the present invention is not limited thereto. Referring to FIG. 1, the source electrode S1 and the drain electrode D3 are the same electrode, and the source electrode S3 is coupled to a ground GND.

In a conventional voltage converter, two power semiconductor elements of the high-side portion are connected in a cascode connection in order to enhance voltage withstanding capability. However, the cascode connection causes an increase in the on-resistance of the high-side portion, resulting in poor switching efficiency of the high-side portion (the same problem is induced in the low-side portion of the conventional voltage converter is similar, and, thus, the related description is omitted here). In contrast, according to the embodiments of the present invention, the two power semiconductor elements of each of the high-side portion and the low-side portion are connected in parallel, which greatly reduces the on-resistance. Therefore, as compared with the conventional voltage converter, the voltage converter of the present invention can obtain a smaller on-resistance using the same wafer area and further realize better high-voltage withstanding capability, and therefore the voltage converter of the present invention can be applied in conversion of higher voltages. Due to the smaller on-resistance, the power that is consumed during the turned-on period is less, and the switching efficiency is higher. On the other hand, it should be understood that if the on-resistance of the conventional voltage converter and that of the voltage converter of the present invention are the same, the voltage converter of the present invention can be realized by using less wafer area, thus achieving higher cost-effectiveness.

Specifically, the voltage converter of the present invention connects two power semiconductor elements (with different ranges of the SOA) in parallel at each of the high-side portion and low-side portion so as to realize a larger range of the SOA, which can reduce the on-resistance, the power consumption during switching and the wafer use area, thus improving the overall performance at a lower cost.

It should be noted that for the normal operation of the voltage converter 1, the operations of turning on and off the power semiconductor elements NM1 and NM2 in the high-side portion and the power semiconductor elements NM3 and NM4 in the low-side portion need to follow a specific sequence, which will be explained below.

Figure 2:
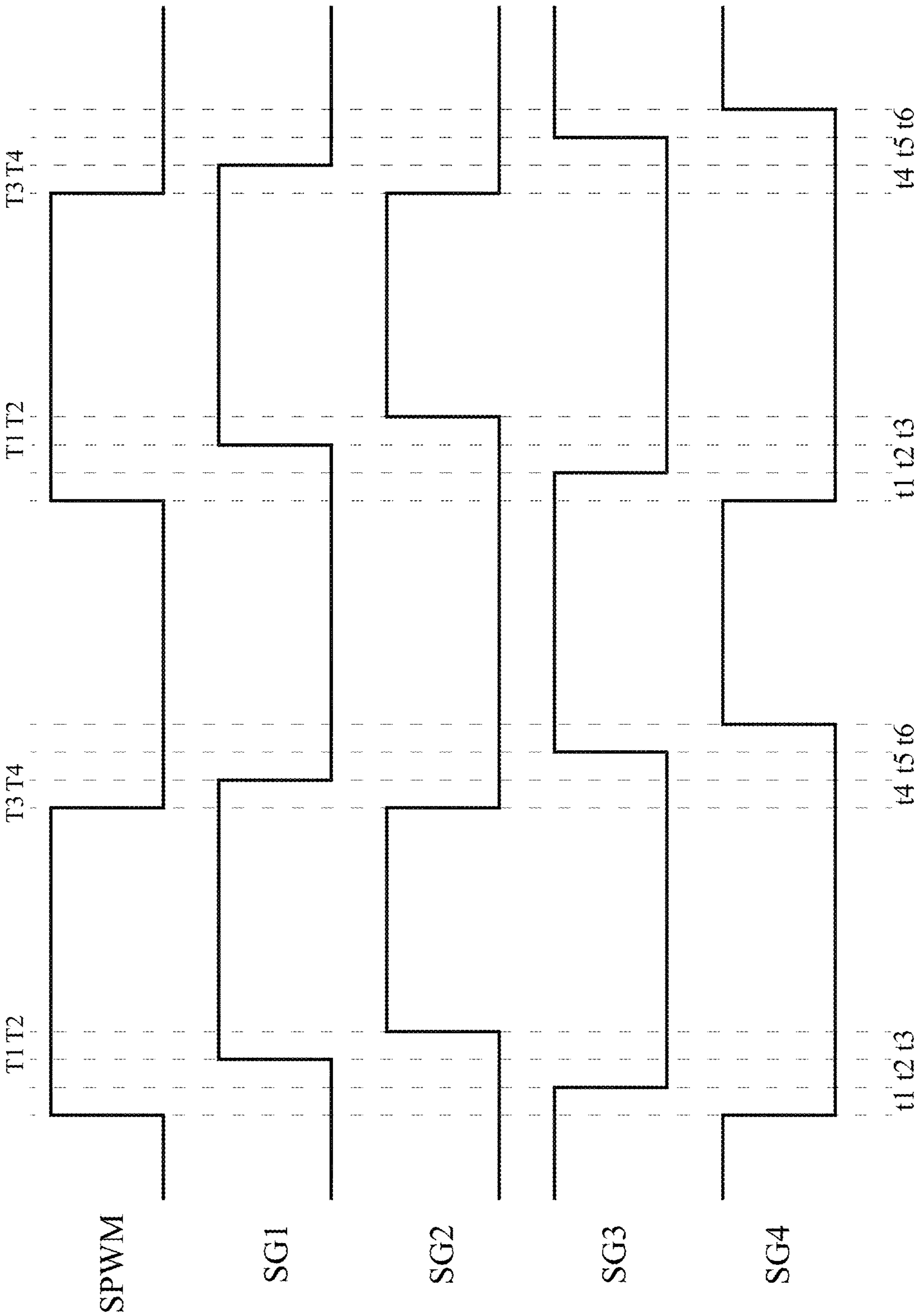
FIG. 2 is a timing diagram of signals of a voltage converter according to some embodiments of the present invention.

FIG. 2 is a timing diagram of signals of the voltage converter 1 according to some embodiments of the present invention. As shown in FIG. 2, time periods t1, t2, and t3 are the processes for turning on the high-side portion (i.e., the power semiconductor elements NM1 and NM2) of the voltage converter 1. At the start point of the time period t1, the PWM signal SPWM is switched or changed from a low voltage level to a high voltage level, which indicates the intention to turn on the high-side portion of the voltage converter 1. In addition, at the start point of the time period t1, the logic signal SG4 is switched or changed from a high voltage level to a low voltage level to turn off the power semiconductor element NM4 via the corresponding buffer BF. Then, at the start point of the time period t2, the logic signal SG3 is switched or changed from a high voltage level to a low voltage level to turn off the power semiconductor element NM4 via the corresponding buffer BF. Next, at the start point (i.e., the time point T1) of the time period t3, the logic signal SG1 is switched or changed from a low voltage level to a high voltage level to turn on the power semiconductor element NM1 via the corresponding buffer BF. Then, at the start point (i.e., the time point T2) of the time period t3, the logic signal SG2 is switched or changed from a low voltage level to a high voltage level to turn on the power semiconductor element NM2 via the corresponding buffer BF.

Specifically, the low-side portion of the voltage converter 1 must be turned off before the high-side portion of the voltage converter 1 is turned on. In the embodiments of the present invention, because the range of the SOA of the power semiconductor element NM3 is larger than that of the power semiconductor element NM4, the time point at which the power semiconductor element NM3 is turned off must be later than the time point at which the power semiconductor element NM4 is turned off, which can reduce the avalanche multiplication effect on the MOSFETs (i.e., the power semiconductor elements NM3 and NM4). Specifically, the time point at which the power semiconductor element NM3 is turned off must be later than the time point at which the power semiconductor element NM4 is turned off to achieve an optimal time point for turning off the low-side portion and to ensure that the power semiconductor elements NM3 and NM4 are in the nominal operation area and are not damaged. Therefore, as shown in FIG. 2, the power semiconductor element NM4 is turned off at the start point of the time period t1, and then the power semiconductor element NM3 is turned off at the start point of the time period t2.

In addition, to ensure the normal operation of the voltage converter 1, after the low-side portion of the voltage converter 1 is turned off, there must be a time delay (i.e., the time period t2), and then the high-side portion of the voltage converter 1 is turned on, thus avoiding that the high-side portion is turned on while the low-side portion has not been completely turned off. Therefore, as shown in FIG. 2, after the power semiconductor element NM3 is turned off at the start point of the time period t2, there is a time delay (i.e., the time period t2), and then the power semiconductor element NM1 is turned on at the start point (i.e., the time point T1) of the time period t3.

After the low-side portion of the voltage converter 1 is turned off, the high-side portion of the voltage converter 1 is then turned on. In some embodiments of the present invention, because the range of the SOA of the power semiconductor element NM1 is larger than that of the power semiconductor element NM2, the time point at which the power semiconductor element NM1 is turned on must be earlier than the time point at which the power semiconductor element NM2 is turned on to achieve an optimal time point for turning on the high-side portion and to ensure that the power semiconductor elements NM1 and NM2 are in the nominal operation area and are not damaged. Therefore, as shown in FIG. 2, the power semiconductor element NM1 is turned on at the start point of the time period t3, and then the power semiconductor element NM2 is turned on at the end point of the time period t3.

As shown in FIG. 2, the time periods t4, t5 and t6 are the processes for turning on the low-side portion (i.e., the power semiconductor elements NM3 and NM4) of the voltage converter 1. At the start point (i.e., the time point T3) of the time period t4, the PWM signal SPWM is switched or changed from a high voltage level to a low voltage level, which indicates the intention to turn on the low-side portion of the voltage converter 1. In addition, at the start point of the time period t4, the logic signal SG2 is switched or changed from a high voltage level to a low voltage level to turn off the power semiconductor element NM2 via the corresponding buffer BF. Next, at the start point (i.e., the time point T4) of the time period t5, the logic signal SG1 is switched or changed from a high voltage level to a low voltage level to turn off the power semiconductor element NM1 via the corresponding buffer BF. Then, at the start point of the time period t6, the logic signal SG3 is switched or changed from the low voltage level to the high voltage level to turn on the power semiconductor element NM3 via the corresponding buffer BF. Then, at the end point of the time period t6, the logic signal SG4 is switched or changed from a low voltage level to a high voltage level to turn on the power semiconductor element NM2 via the corresponding buffer BF.

Specifically, the high-side portion of the voltage converter 1 must be turned off before the low-side portion of the voltage converter 1 is turned on. In some embodiments of the present invention, because the range of the SOA of the power semiconductor element NM1 is larger than that of the power semiconductor element NM2, the time point at which the power semiconductor element NM1 is turned off must be later than the time point at which the power semiconductor element NM2 is turned off, which can reduce the avalanche multiplication effect on the MOSFETs (i.e., the power semiconductor elements NM1 and NM2). Specifically, the time point at which the power semiconductor element NM1 is turned off must be later than the time point at which the power semiconductor element NM2 is turned off to achieve an optimal time point for turning off the high-side portion and to ensure that the power semiconductor elements NM1 and NM2 are in the nominal operation area and are not damaged. Therefore, as shown in FIG. 2, the power semiconductor element NM2 is turned off at the start point of time period t4, and then the power semiconductor element NM1 is turned off at the start point of the time period t5.

In addition, to ensure the normal operation of the voltage converter 1, after the high-side portion of the voltage converter 1 is turned off, there must be a time delay (i.e., the time period t5), and then the low-side portion of the voltage converter 1 is turned on, thus avoiding that the low-side portion is turned on while the high-side portion has not been completely turned off. Therefore, as shown in FIG. 2, after the power semiconductor element NM1 is turned off at the start point (i.e., the time point T4) of the time period t5, there is a time delay (i.e., the time period t5), and then the power semiconductor element NM3 is turned on at the start point of the time period t6.

After the high-side portion of the voltage converter 1 is turned off, the low-side portion of the voltage converter 1 is then turned on. In some embodiments of the present invention, because the range of the SOA of the power semiconductor element NM3 is larger than that of the power semiconductor element NM4, the time point at which the power semiconductor element NM3 is turned on must be earlier than the time point at which the power semiconductor element NM4 is turned on. In this way, the power semiconductor element NM4 is in the nominal operation area when being turned on, thus achieving an optimal time point for turning on the low-side portion and ensuring that the power semiconductor elements NM3 and NM4 are in the nominal operation area and are not damaged. Therefore, as shown in FIG. 2, the power semiconductor element NM3 is turned on at the start point of the time period t6, and then the power semiconductor element NM4 is turned on at the end point of the time period t6.

Figure 3:
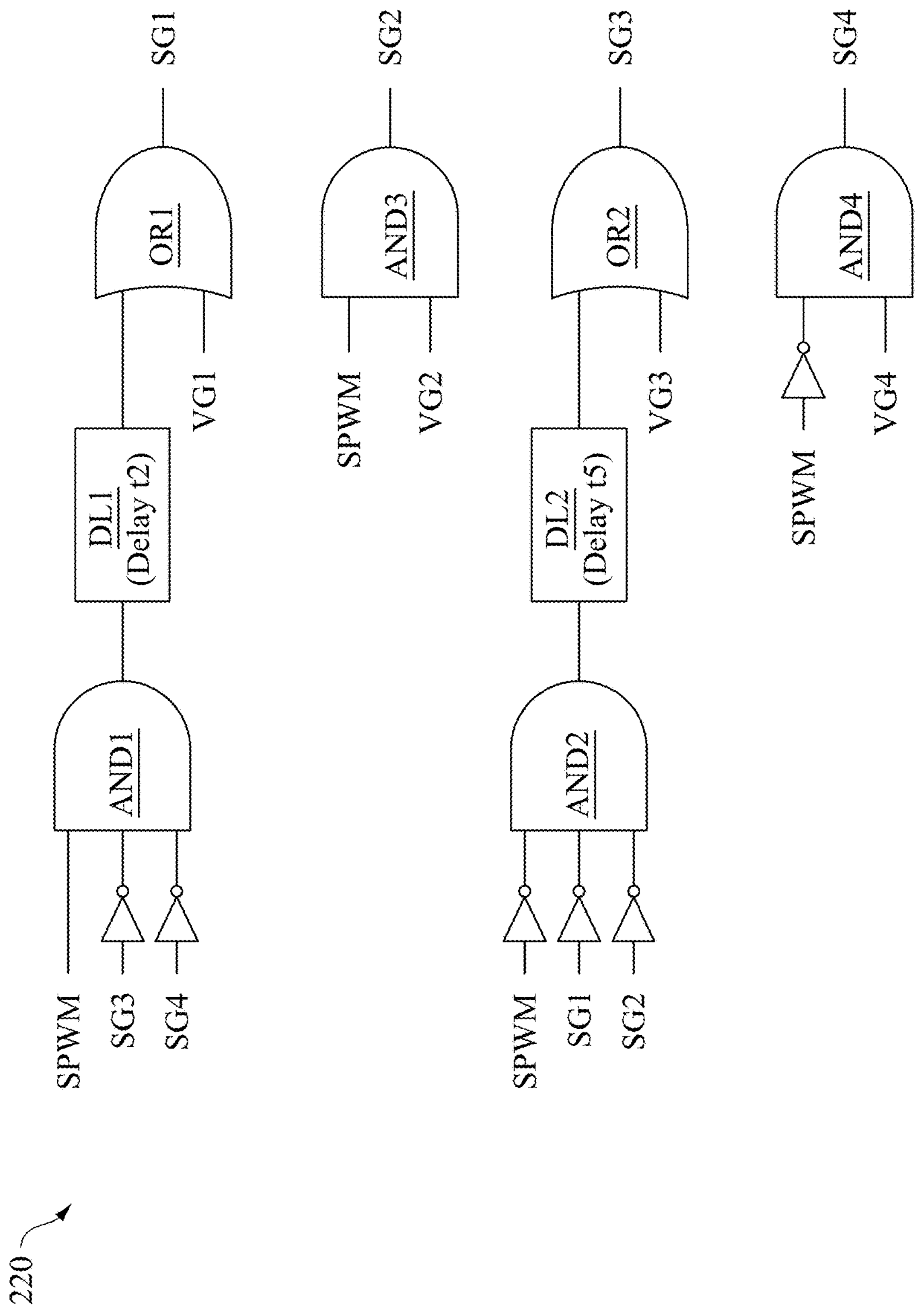
FIG. 3 is an exemplary circuit diagram of a control logic circuit according to some embodiments of the present invention.

FIG. 3 is an exemplary circuit diagram of a control logic circuit 220 according to some embodiments of the present invention. The control logic circuit 220 includes AND gates AND1~AND4, OR gates OR1 and OR2, and time delayers DL1 and DL2. The AND gate AND1 receives the PWM signal SPWM, an inverted signal of the logic signal SG3 (as shown in FIG. 3, the logic signal SG3 passes through an inverter and is then received by the AND gate AND1), and an inverted signal of the logic signal SG4. One input terminal of the OR gate OR1 is coupled to an output terminal of the AND gate AND1 via the time delayer DL1 (i.e., the input terminal of the OR gate OR1 is coupled to the output terminal of the AND gate AND1), and the other input terminal of the OR gate OR1 receives the voltage VG1, so that the OR gate OR1 outputs the logic signal SG1. In other words, the control logic circuit 220 provides the logic signal SG1 based on the voltage VG1, the logic signals SG3 and SG4, and the PWM signal SPWM. The time delayer DL1 provides a delay time. In some embodiments, the length of the delay time provided by the time delayer DL1 is equal to the length of the time period t2 as shown in FIG. 2, and therefore, the time period t2 may also be referred to as the delay time. The AND gate AND2 receives an inverted signal of the PWM signal SPWM, an inverted signal of the logic signal SG1 and an inverted signal of the logic signal SG2. One input terminal of the OR gate OR2 is coupled to the output terminal of the AND gate AND2 via the time delayer DL2 (i.e., the input terminal of the OR gate OR2 is coupled to the output terminal of the AND gate AND2), and the other input terminal of the OR gate OR2 receives the voltage VG3, so that the OR gate OR2 outputs the logic signal SG3. In other words, the control logic circuit 220 provides the logic signal SG3 based on the voltage VG3, the logic signals SG1 and SG2, and the PWM signal SPWM. The time delayer DL2 provides a delay time. In some embodiments, the length of the delay time provided by the time delayer DL2 is equal to the length of the time period t5 as shown in FIG. 2, and therefore, the time period t5 may also be referred to as the delay time. The AND gate AND3 receives the PWM signal SPWM and the voltage VG2 and outputs the logic signal SG2 accordingly (in other words, the control logic circuit 220 provides the logic signal SG2 according to the PWM signal SPWM and the voltage VG2). The AND gate AND4 receives the inverted signal of the PWM signal SPWM and the voltage VG4 and outputs the logic signal SG4 accordingly (in other words, control logic circuit 220 provides the logic signal SG4 according to the PWM signal SPWM and the voltage VG4).

Figure 4B:
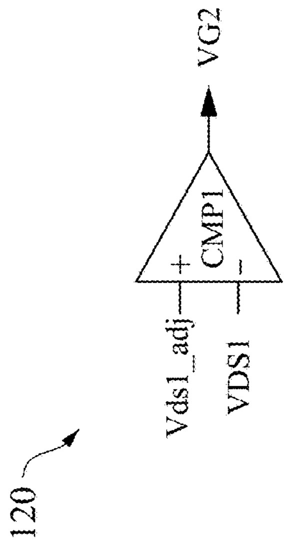
FIG. 4B is an exemplary circuit diagram of a time delay circuit according to some embodiments of the present invention.
Figure 4A:
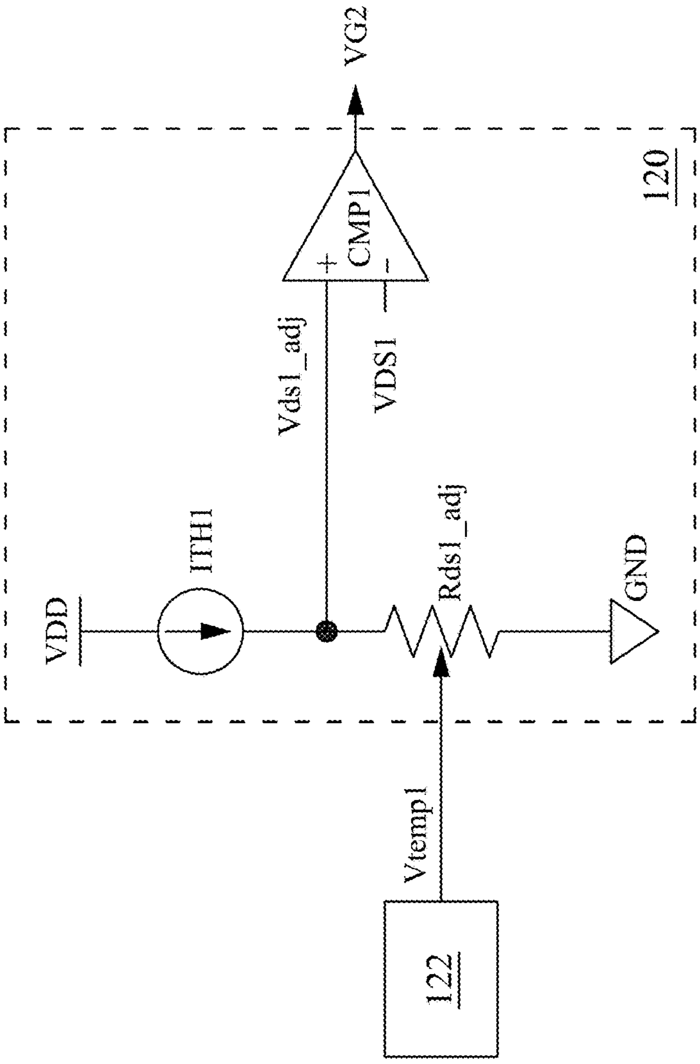
FIG. 4A is an exemplary circuit diagram of a temperature sensor and a time delay circuit according to some embodiments of the present invention.

FIG. 4A is an exemplary circuit diagram of the temperature sensor 122 and the time delay circuit 120 according to some embodiments of the present invention. As shown in FIG. 4A, the time delay circuit 120 receives the sensing voltage Vtemp1 from the temperature sensor 122, generates a reference voltage Vds1_adj based on the sensing voltage Vtemp1, compares the reference voltage Vds1_adj with a drain-source voltage VDS1 (i.e., a voltage difference between the drain electrode D1 and the source electrode S1 of FIG. 1) of the power semiconductor element NM1 to generate a comparison result, and finally outputs the voltage VG2 according to the comparison result.

In detail, as shown in FIG. 4A, the time delay circuit 120 includes a current source ITH1, a resistor Rds1_adj, and a comparator CMP1. The current source ITH1 is coupled to the resistor Rds1_adj in series between a system voltage VDD and the ground GND. A positive input terminal (+) of the comparator CMP1 is coupled to a node between the current source ITH1 and the resistor Rds1_adj to receive the reference voltage Vds1_adj, and a negative input terminal (−) thereof receives the drain-source voltage VDS1. The comparator CMP1 performs a comparison operation based on the reference voltage Vds1_adj and the drain-source voltage VDS1. When the reference voltage Vds1_adj is greater than the drain-source voltage VDS1, the voltage VG2, which is outputted or generated by the comparator CMP1 from its output terminal, is at a high voltage level. When the reference voltage Vds1_adj is less than the drain-source voltage VDS1, the voltage VG2 is at a low voltage level.

As shown in FIG. 4A, the resistor Rds1_adj receives the sensing voltage Vtemp1. In the embodiment of FIG. 4A, the resistor Rds1_adj is a voltage-controlled element (i.e., a voltage-controlled resistor) that responds to the sensing voltage Vtemp1. As the sensing voltage Vtemp1 increases, the resistance of the resistor Rds1_adj increases. The current outputted from the current source ITH1 does not vary with the temperature. In other words, because the sensing voltage Vtemp1 increases as the temperature of the power semiconductor elements NM1 and NM2 increases, the resistance of the resistor Rds1_adj increases as the temperature of the power semiconductor elements NM1 and NM2 increases. In this way, the reference voltage Vds1_adj increases as the temperature of the power semiconductor elements NM1 and NM2 increases.

Figure 5:
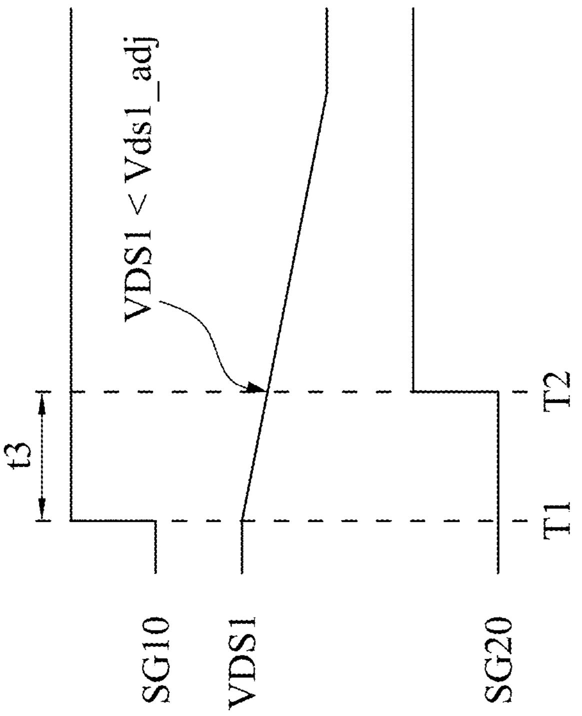
FIG. 5 is a timing diagram of signals of a high-side portion of a voltage converter in a turned-on phase according to some embodiments of the present invention.

FIG. 5 is a timing diagram of signals of the high-side portion of the voltage converter 1 in a turned-on phase according to some embodiments of the present invention. The detailed operation of the high-side portion of the voltage converter 1 in the turned-on phase is further described below with reference to FIGS. 1 to 4A and 5. First, before the time point T1, the logic signals SG1 and SG2 are both at the low voltage level (as shown in FIG. 2), and the control signals SG10 and SG20 generated by the buffers BF are correspondingly at a low voltage level (as shown in FIG. 5). As shown in FIG. 1, because the control signals SG10 and SG20 are respectively supplied to the gate electrode G1 of the power semiconductor element NM1 and the gate electrode G2 of the power semiconductor element NM2, the power semiconductor elements NM1 and NM2 are turned off.

Then, at the time point T1, the logic signal SG1 is switched or changed from the low voltage level to the high voltage level (as shown in FIG. 2), which causes the control signal SG10 to be also switched or changed from the low voltage level to a high voltage level (as shown in FIG. 5). In this way, the control signal SG10 with the high voltage level turns on the power semiconductor element NM1.

Then, after the time point T1, as the power semiconductor element NM1 is turned on, the drain-source voltage VDS1 of the power semiconductor element NM1 gradually decreases (as shown in FIG. 5). In addition, as shown in FIG. 4A, as the power semiconductor element NM1 is turned on, the temperature of the power semiconductor elements NM1 and NM2 gradually increases, so that the reference voltage Vds1_adj gradually increases. At the time point T2, the drain-source voltage VDS1 of the power semiconductor element NM1 is less than the reference voltage Vds1_adj (as shown in FIG. 5), and the voltage VG2 outputted by the comparator CMP1 is switched or changed from the low voltage level to the high voltage level. According to FIG. 2, at the time point T2, the PWM signal SPWM is at the high voltage level. Therefore, through the operation by the AND gate AND3 in FIG. 3, the logic signal SG2 is switched or changed to the high voltage level at the time point T2, so that the control signal SG20 is also at the high voltage level. Therefore, the control signal SG20 with the high voltage level turns on the power semiconductor element NM2.

Specifically, the time delay circuit 120 controls the reference voltage Vds1_adj within the range of the SOA of the power semiconductor element NM2 to ensure that the drain-source voltage VDS1 of the turned-on power semiconductor element NM2 is also within its range of the SOA, which can ensure that the power semiconductor elements NM1 and NM2 are in the nominal operation area.

The present invention utilizes the time delay circuit 120 to dynamically adjust the time delay (i.e., the time period t3) between the time point (i.e., the time point T2) at which the power semiconductor element NM2 is turned on and the time point (i.e., the time point T1) at which the power semiconductor element NM1 is turned on in accordance with the temperature of the power semiconductor elements NM1 and NM2. In other words, the above time delay is not provided with a fixed time length. Specifically, the high-side portion of the voltage converter 1 of the present invention applies or performs a mechanism for automatically adjusting its turned-on delay according to the temperature of the power semiconductor elements NM1 and NM2, so as to achieve the optimal time point for turning on the high-side portion.

According to the above description, the reference voltage Vds1_adj is related to the temperature of the power semiconductor elements NM1 and NM2. In detail, the reference voltage Vds1_adj increases as the temperature of the power semiconductor elements NM1 and NM2 increases, and is controlled within the range of the SOA of the power semiconductor element NM2. In general, the range of the SOA of a power semiconductor element varies with the operating temperature and/or with variations in the process.

In other embodiments of the present invention (e.g., the embodiment of FIG. 4B), the voltage converter 1 may be coupled to or include a memory that stores a lookup table. The memory may be disposed within the driving circuit 100, such as within the control logic circuit 220. The lookup table includes a plurality of preset sensing voltage values as indexes and further includes a plurality of preset reference voltage values as output values. The plurality of preset sensing voltages corresponds to different temperature values or temperature ranges of a power semiconductor element, and the plurality of preset reference voltages corresponds to different ranges of the SOA of the power semiconductor element. In the lookup table, the aforementioned plurality of preset sensing voltage values may respectively correspond to the aforementioned plurality of preset reference voltage values, that is, the aforementioned plurality of preset sensing voltage values may respectively correspond to different ranges of the SOA; or at least two of the aforementioned preset sensing voltage values may correspond to the same preset reference voltage value, that is, at least two of the aforementioned preset sensing voltage values may correspond to the same range of the SOA.

Referring to FIG. 4B, in some embodiments, the time delay circuit 120 includes only the comparator CMP1 but does not include the current source ITH1 and the resistor Rds1_adj in the embodiment of FIG. 4A. The positive input terminal (+) of the comparator CMP1 receives the reference voltage Vds1_adj, and the negative input terminal (−) thereof receives the drain-source voltage VDS1. The voltage converter 1 (or the driving circuit 100 or the control logic circuit 220) searches or checks the aforementioned lookup table in the memory according to the sensing voltage Vtemp1 (corresponding to one preset sensing voltage value in the aforementioned lookup table) generated by the temperature sensor 122 to obtain a corresponding preset reference voltage value as the reference voltage Vds1_adj. It can be known from the above description that, the reference voltage Vds1_adj of FIG. 4B increases as the temperature of the power semiconductor elements NM1 and NM2 increases and further corresponds to the range of the SOA of the power semiconductor element NM2 at the temperature of the power semiconductor elements NM1 and NM2.

Referring to FIGS. 1, 2, 4B and 5, at the time point T1, the logic signal SG1 is switched or changed from the low voltage level to the high voltage level (as shown in FIG. 2), and the control signal SG10 is switched or changed from the low voltage level to the high voltage level (as shown in FIG. 5) to turn on the power semiconductor element NM1. In response to the power semiconductor element NM1 being turned on, the drain-source voltage VDS1 of the power semiconductor element NM1 gradually decreases (as shown in FIG. 5). In addition, as shown in FIG. 4B, the temperature of the power semiconductor elements NM1 and NM2 gradually increases due to the turned-on power semiconductor element NM1, which causes the reference voltage Vds1_adj to increase. At the time point T2, the drain-source voltage VDS1 is less than the reference voltage Vds1_adj (as shown in FIG. 5), and the voltage VG2 outputted by the comparator CMP1 is switched or changed from the low voltage level to the high voltage level. It can be known from FIG. 2 that at the time point T2, the PWM signal SPWM is at the high voltage level. Therefore, through the operation by the AND gate AND3 in FIG. 3, the logic signal SG2 is switched or changed to the high voltage level at the time point T2, so that the control signal SG20 is also at the high voltage level. Thus, the control signal SG20 with the high voltage level can turn on the power semiconductor element NM2. In this way, the time delay circuit 120 can dynamically adjust the time delay (i.e., the time period t3) between the time point (i.e., the time point T2) at which the power semiconductor element NM2 is turned on and the time point (i.e., time point T1) at which the power semiconductor element NM1 is turned on with the temperature of the power semiconductor elements NM1 and NM2.

Figure 6B:
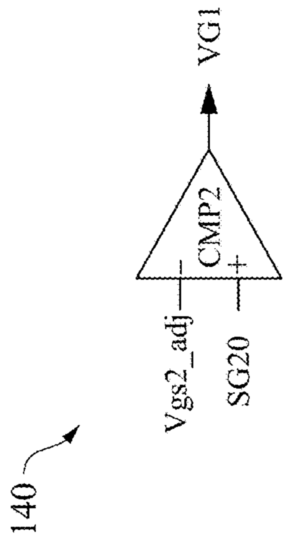
FIG. 6B is an exemplary circuit diagram of a time delay circuit according to some embodiments of the present invention.
Figure 6A:
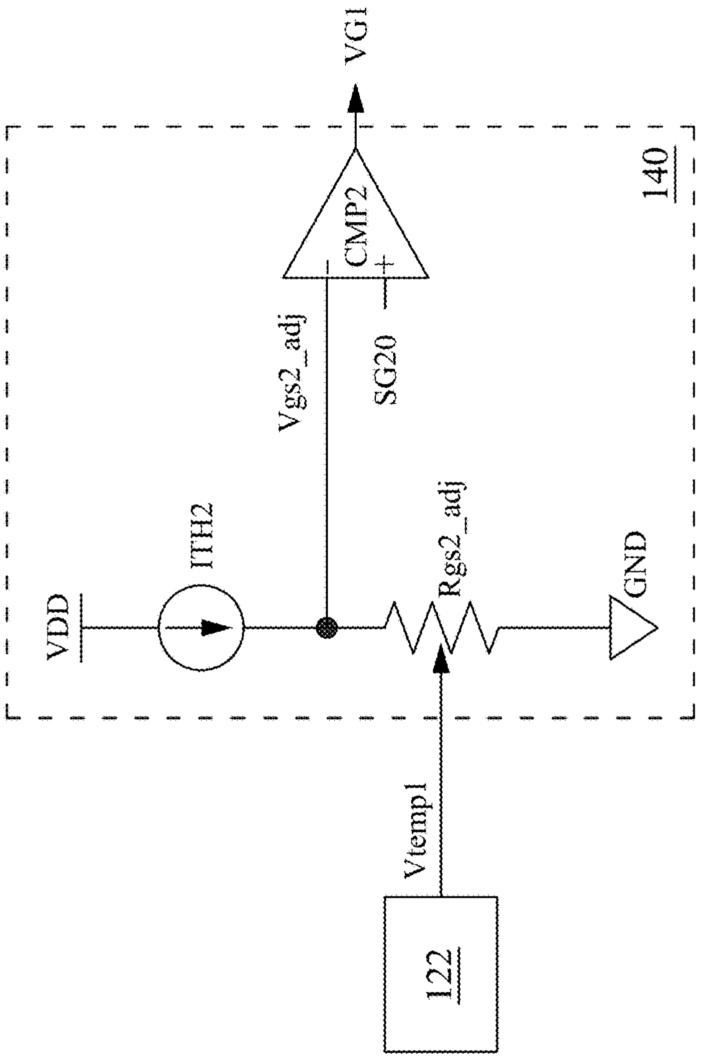
FIG. 6A is an exemplary circuit diagram of a temperature sensor and a time delay circuit according to some embodiments of the present invention.

FIG. 6A is an exemplary circuit diagram of the temperature sensor 122 and the time delay circuit 140 according to some embodiments of the present invention. As shown in FIG. 6A, the time delay circuit 140 receives a sensing voltage Vtemp1 from the temperature sensor 122 and receives a control signal SG20. The time delay circuit 140 generates a reference voltage Vgs2_adj based on the sensing voltage Vtemp1, compares the reference voltage Vgs2_adj with the voltage level of the control signal SG20 to generate a comparison result, and outputs a voltage VG1 based on the comparison result.

In detail, as shown in FIG. 6A, the time delay circuit 140 includes a current source ITH2, a resistor Rgs2_adj, and a comparator CMP2. The current source ITH2 is coupled to the resistor Rgs2_adj in series between the system voltage VDD and the ground GND. A negative input terminal (−) of the comparator CMP2 is coupled to the node between the current source ITH2 and the resistor Rgs2_adj to receive the reference voltage Vgs2_adj, and a positive input terminal (+) thereof receives the control signal SG20. The comparator CMP2 performs a comparison operation based on the voltage level of the control signal SG20 and the reference voltage Vgs2_adj. When the voltage level of the control signal SG20 is greater than the reference voltage Vgs2_adj, the voltage VG1, which is outputted or generated by the comparator CMP2 through its output terminal, is at a high voltage level. When the voltage level of the control signal SG20 is less than the reference voltage Vgs2_adj, the voltage VG1 is at a low voltage level.

As shown in FIG. 6A, the resistor Rgs2_adj receives the sensing voltage Vtemp1. In the embodiment of FIG. 6A, the resistor Rgs2_adj is a voltage-controlled element (i.e., a voltage-controlled resistor) that responds to the sensing voltage Vtemp1. As the sensing voltage Vtemp1 decreases, the resistance of the resistor Rgs2_adj increases. The current outputted from the current source ITH2 does not vary with the temperature. In other words, because the sensing voltage Vtemp1 decreases as the temperature of the power semiconductor elements NM1 and NM2 decreases, the resistance of the resistor Rgs2_adj increases as the temperature of the power semiconductor elements NM1 and NM2 decreases. In this way, the reference voltage Vgs2_adj increases as the temperature of the power semiconductor elements NM1 and NM2 decreases.

Figure 7:
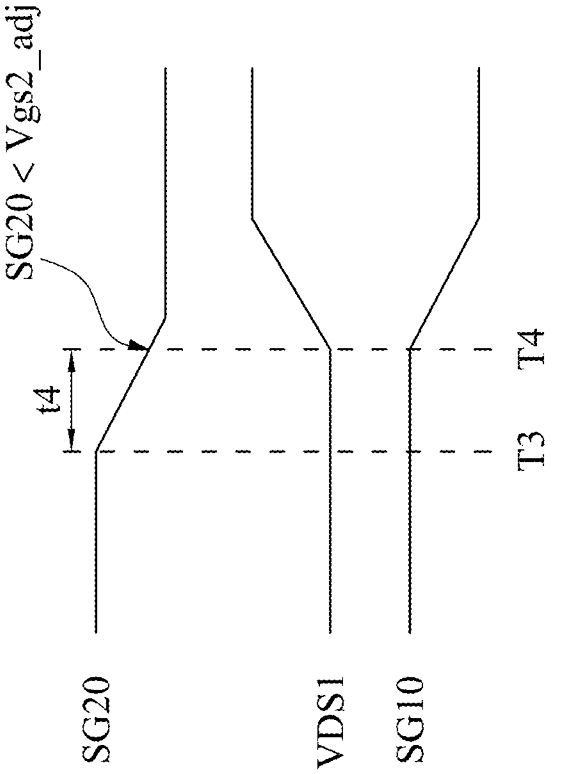
FIG. 7 is a timing diagram of signals of a high-side portion of a voltage converter in a turned-off phase according to some embodiments of the present invention.

FIG. 7 is a timing diagram of signals of the high-side portion of the voltage converter 1 in a turned-off phase according to some embodiments of the present invention. The detailed operation of the high-side portion of the voltage converter 1 in the turned-off phase is further described below with reference to FIGS. 1 to 3, 6A and 7. First, before the time point T3, the logic signals SG1 and SG2 are both at a high voltage level (as shown in FIG. 2), and the control signals SG10 and SG20 generated by the corresponding buffers BF are correspondingly at a high voltage level (as shown in FIG. 7). As shown in FIG. 1, because the control signals SG10 and SG20 are respectively supplied to the gate electrode G1 of the power semiconductor element NM1 and the gate electrode G2 of the power semiconductor element NM2, the power semiconductor elements NM1 and NM2 are turned on.

Then, at the time point T3, the logic signal SG2 is switched or changed from the high voltage level to the low voltage level (as shown in FIG. 2), which causes the control signal SG20 to gradually decrease from the high voltage level to the low voltage level (as shown in FIG. 7), and thus the control signal SG20 gradually turns off the power semiconductor element NM2.

Further, after the time point T3, as the power semiconductor element NM2 is gradually turned off, the temperature of the power semiconductor elements NM1 and NM2 gradually decreases, so that the reference voltage Vgs2_adj gradually increases. At the time point T4, the voltage level of the control signal SG20 is less than the reference voltage Vgs2_adj (as shown in FIG. 7), and the voltage VG1 outputted by the comparator CMP2 is switched or changed from the high voltage level to the low voltage level. According to FIG. 4, at the time point T4, the PWM signal SPWM is at the low voltage level. Therefore, through the operation by the AND gate AND1 and the OR gate OR1 in FIG. 3, the logic signal SG1 is switched or changed from the high voltage level to the low voltage level at the time point T4, so that the control signal SG10 gradually decreases from the high voltage level to the low voltage level (as shown in FIG. 7). Therefore, the control signal SG10 gradually turns off the power semiconductor element NM1.

Specifically, the time delay circuit 140 controls the reference voltage Vgs2_adj within the range of turned-off operation of the power semiconductor element NM2. In addition, the turned-off delay of the power semiconductor element NM1 is dynamically adjusted to ensure that the power semiconductor element NM2 is actually turned off, and then the power semiconductor element NM1 is turned off, so that the power semiconductor elements NM1 and NM2 remain in the nominal operation area without being damaged.

The present invention utilizes the time delay circuit 140 to dynamically adjust the time delay (i.e., the time period t4) between the time point (i.e., the time point T4) at which the power semiconductor element NM1 is turned off and the time point (i.e., the time point T3) at which the power semiconductor element NM2 is turned off in accordance with the temperature of the power semiconductor elements NM1 and NM2. In other words, the above time delay is not provided with a fixed time length. Specifically, the high-side portion of the voltage converter 1 of the present invention applies or performs a mechanism for automatically adjusting its turned-off delay according to the temperature of the power semiconductor elements NM1 and NM2, so as to achieve the optimal time point for turning off the high-side portion.

According to the above description, the reference voltage Vgs2_adj is generated by the current source ITH2 and the resistor Rgs2_adj according to the sensing voltage Vtemp1, and is related to the temperature of the power semiconductor elements NM1 and NM2. In detail, the reference voltage Vgs2_adj increases as the temperature of the power semiconductor elements NM1 and NM2 decreases. In other embodiments, the reference voltage Vgs2_adj indicates a threshold voltage (Vth) of the power semiconductor element NM2. Generally, the threshold voltage of a power semiconductor element varies with the operating temperature and/or with variations in the process.

In other embodiments of the invention, the voltage converter 1 may be coupled to or include a memory that stores a lookup table. The memory may be disposed within the driving circuit 100, such as within the control logic circuit 220. The lookup table further includes a plurality of preset sensing voltage values as indexes and includes a plurality of preset reference voltage values as output values. The plurality of preset sensing voltages corresponds to different temperature values or temperature ranges of a power semiconductor element, and the plurality of preset reference voltages corresponds to different threshold voltages of the power semiconductor element. In the lookup table, the aforementioned plurality of preset sensing voltage values may respectively correspond to the aforementioned plurality of preset reference voltage values, that is, the aforementioned plurality of preset sensing voltage values may respectively correspond to different threshold voltages; or at least two of the aforementioned preset sensing voltage values may correspond to the same preset reference voltage value, that is, at least two of the aforementioned preset sensing voltage values may correspond to the same threshold voltage.

Referring to FIG. 6B, in some embodiments, the time delay circuit 140 includes only the comparator CMP2 but does not include the current source ITH2 and the resistor Rgs2_adj of the embodiment of FIG. 6A. The positive input terminal (+) of the comparator CMP1 receives the control signal SG20 and the negative input terminal (−) thereof receives the reference voltage Vgs2_adj. The voltage converter 1 (or the driving circuit 100 or the control logic circuit 220) searches or checks the aforementioned lookup table in the memory according to the sensing voltage Vtemp1 (corresponding to one preset sensing voltage value in the aforementioned lookup table) generated by the temperature sensor 122 to obtain a corresponding preset reference voltage value, as the reference voltage Vgs2_adj. It can be known from the above description that, the reference voltage Vgs2_adj of FIG. 6B increases as the temperature of the power semiconductor elements NM1 and NM2 decreases and further corresponds to the threshold voltage of the power semiconductor element NM2 at the temperature of the power semiconductor elements NM1 and NM2.

Referring to FIGS. 1, 2, 6B and 7, at the time points T1 and T3, the logic signal SG2 is switched or changed from the high voltage level to the low voltage level (as shown in FIG. 2), and the control signal SG20 also decreases gradually from the high voltage level to the low voltage level (as shown in FIG. 7) to gradually turn off the power semiconductor element NM2. In response to the power semiconductor element NM2 being gradually turned-off, the temperature of the power semiconductor elements NM1 and NM2 gradually decreases as the power semiconductor element NM2 is gradually turned off, which causes the reference voltage Vgs2_adj to gradually increase. At the time point T4, the control signal SG20 is less than the reference voltage Vgs2_adj (as shown in FIG. 7), and the voltage VG1 outputted by the comparator CMP2 is switched or changed from the high voltage level to the low voltage level. It can be known from FIG. 2 that, at the time point T4, the PWM signal SPWM is at a low voltage level. Therefore, through the operation by the AND gate AND1 and the OR gate OR1 in FIG. 3, the logic signal SG1 is switched or changed from the high voltage level to the low voltage level at the time point T4, which causes the control signal SG10 to gradually decrease from the high voltage level to the low voltage level (as shown in FIG. 7), and thus the control signal SG10 gradually turns off the power semiconductor element NM1. In this way, the time delay circuit 140 can dynamically adjust the time delay (i.e., the time period t4) between the time point (i.e., the time point T4) at which the power semiconductor element NM1 is turned off and the time point (i.e., the time point T3) at which the power semiconductor element NM2 is turned off in accordance with the temperature of the power semiconductor elements NM1 and NM2.

Figure 8:
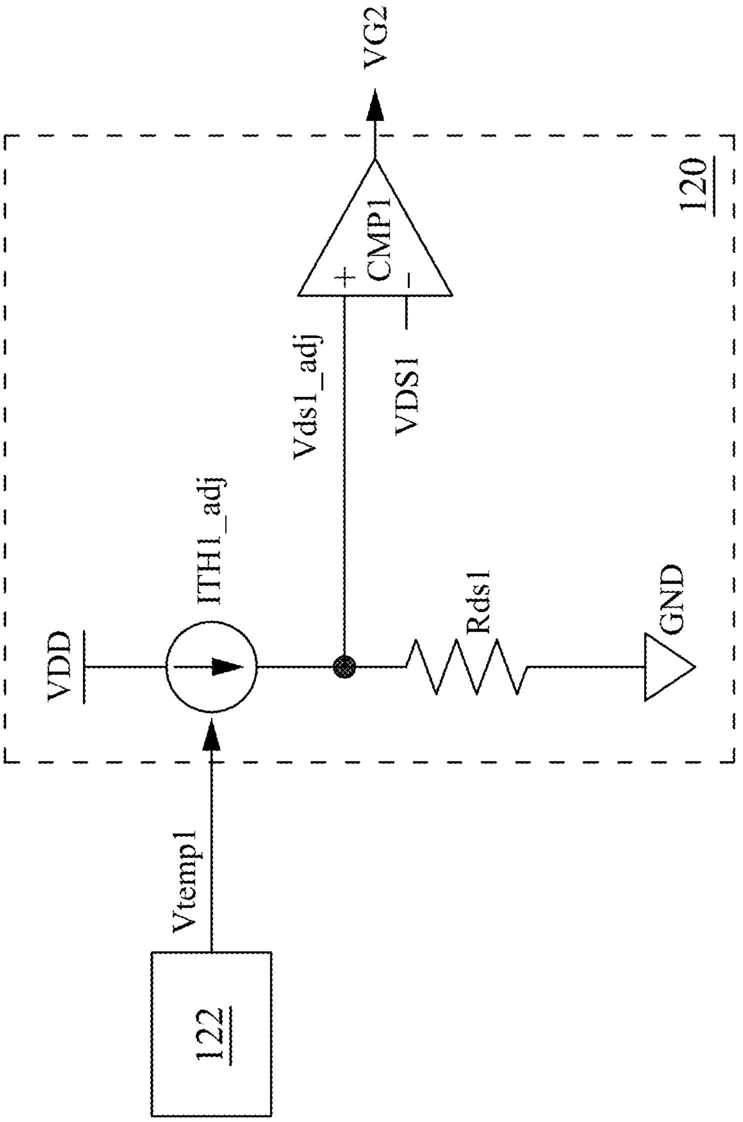
FIG. 8 is another exemplary circuit diagram of a time delay circuit according to some embodiments of the present invention.

FIG. 8 is another exemplary circuit diagram of the time delay circuit 120 according to some embodiments of the present invention. The time delay circuit 120 of FIG. 8 is similar to the time delay circuit 120 of FIG. 4A, except that the current source ITH1 and the resistor Rds1_adj of the time delay circuit 120 in FIG. 4A are replaced with the current source ITH1_adj and the resistor Rds1 in the time delay circuit 120 in FIG. 8. Specifically, the time delay circuit 120 of FIG. 8 has similar functions to the time delay circuit 120 of FIG. 4A, and thus the time delay circuit 120 in the embodiment shown in FIG. 1 may also be implemented by utilizing the time delay circuit 120 of FIG. 8.

In detail, as shown in FIG. 8, the current source ITH1_adj is coupled to the resistor Rds1 in series between a system voltage VDD and the ground GND, and the current source ITH1_adj receives a sensing voltage Vtemp1. In the embodiment of FIG. 8, the current source ITH1_adj is a voltage-controlled element (i.e., a voltage-controlled current source) that responds to the sensing voltage Vtemp1. As the sensing voltage Vtemp1 increases, the current of the current source ITH1_adj increases. The resistance of the resistor Rds1 does not vary with temperature. In other words, because the sensing voltage Vtemp1 increases as the temperature of the power semiconductor elements NM1 and NM2 increases, the current outputted from the current source ITH1_adj increases as the temperature of the power semiconductor elements NM1 and NM2 increases. In this way, the reference voltage Vds1_adj increases as the temperature of the power semiconductor elements NM1 and NM2 increases.

Figure 9:
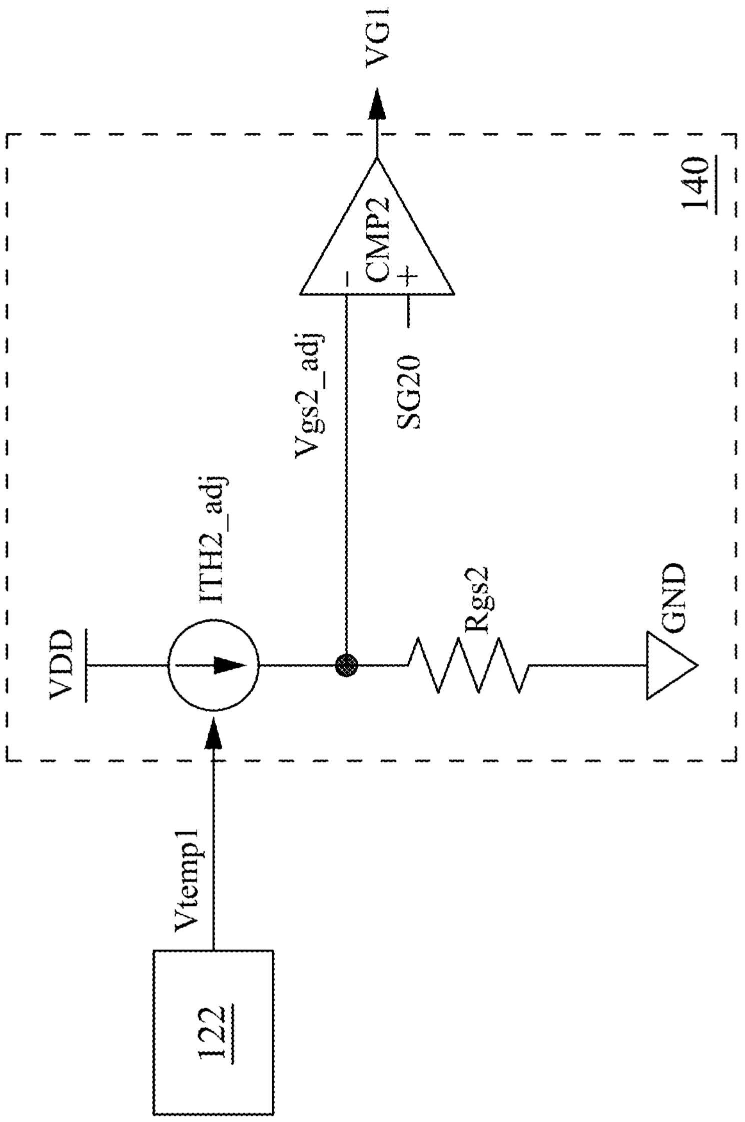
FIG. 9 is another exemplary circuit diagram of a time delay circuit according to some embodiments of the present invention.

FIG. 9 is another exemplary circuit diagram of the time delay circuit 140 according to some embodiments of the present invention. The time delay circuit 140 of FIG. 9 is similar to the time delay circuit 140 of FIG. 6A, except that the current source ITH2 and the resistor Rgs2_adj of the time delay circuit 140 of FIG. 6A are replaced with the current source ITH2_adj and the resistor Rgs2 in the time delay circuit 140 of FIG. 9. Specifically, the time delay circuit 140 of FIG. 9 has similar functions to the time delay circuit 140 of FIG. 6A, and thus the time delay circuit 140 in the embodiment shown in FIG. 1 may also be implemented by utilizing the time delay circuit 140 of FIG. 9.

In detail, as shown in FIG. 9, the current source ITH2_adj is coupled to the resistor Rgs2 in series between a system voltage VDD and the ground GND, and the current source ITH2_adj receives the sensing voltage Vtemp1. In the embodiment of FIG. 9, the current source ITH2_adj is a voltage-controlled element (i.e., a voltage-controlled current source) that responds to the sensing voltage Vtemp1. As the sensing voltage Vtemp1 decreases, the current of the current source ITH2_adj increases. The resistance of the resistor Rgs2 does not vary with temperature. In other words, because the sensing voltage Vtemp1 decreases as the temperature of the power semiconductor elements NM1 and NM2 decreases, the current outputted from the current source ITH2_adj increases as the temperature of the power semiconductor elements NM1 and NM2 decreases. In this way, the reference voltage Vgs2_adj increases as the temperature of the power semiconductor elements NM1 and NM2 decreases.

Figure 10B:
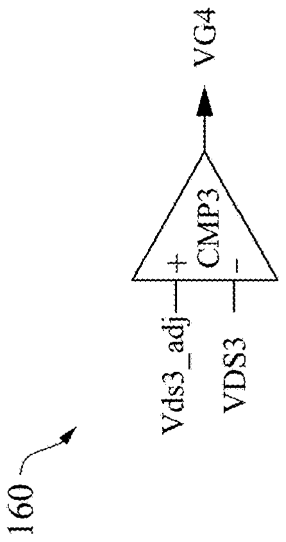
FIG. 10B is an exemplary circuit diagram of a time delay circuit according to some embodiments of the present invention.
Figure 10A:
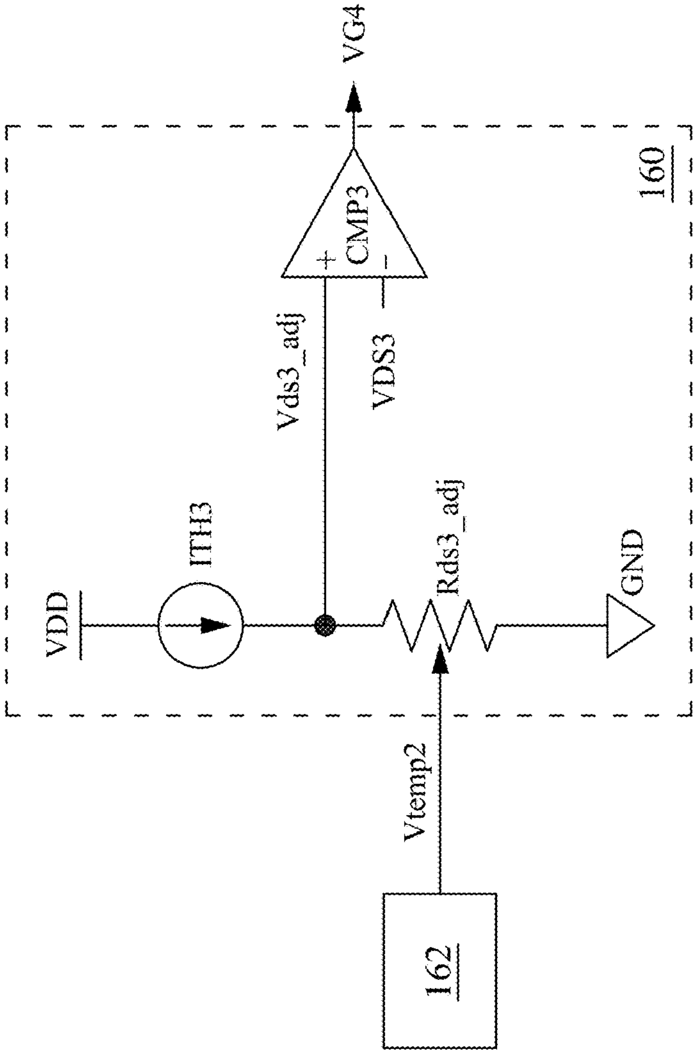
FIG. 10A is an exemplary circuit diagram of a temperature sensor and a time delay circuit according to some embodiments of the present invention.

FIG. 10A is an exemplary circuit diagram of a temperature sensor 162 and a time delay circuit 160 according to some embodiments of the present invention. As shown in FIG. 10A, the time delay circuit 160 receives a sensing voltage Vtemp2 from the temperature sensor 162, generates a reference voltage Vds3_adj according to the sensing voltage Vtemp2, compares the reference voltage Vds3_adj with a drain-source voltage VDS3 (i.e., a voltage difference between the drain electrode D3 and the source electrode S3 in FIG. 1) of the power semiconductor element NM3 to generate a comparison result, and outputs a voltage VG4 according to the comparison result.

In detail, as shown in FIG. 10A, the time delay circuit 160 includes a current source ITH3, a resistor Rds3_adj, and a comparator CMP3. The current source ITH3 is coupled to the resistor Rds3_adj in series between the system voltage VDD and the ground GND. A positive input terminal (+) of the comparator CMP3 is coupled to the node between the current source ITH3 and the resistor Rds3_adj to receive the reference voltage Vds3_adj, and a negative input terminal (−) thereof receives the drain-source voltage VDS3 of the power semiconductor component NM3. The comparator CMP3 performs a comparison operation based on the reference voltage Vds3_adj and the drain-source voltage VDS3. When the reference voltage Vds3_adj is greater than the drain-source voltage VDS3, the voltage VG4, which is outputted or generated by the comparator CMP3 from its output terminal, is at a high voltage level. When the reference voltage Vds3_adj is less than the drain-source voltage VDS3, the voltage VG4 is at a low voltage level.

As shown in FIG. 10A, the resistor Rds3_adj receives the sensing voltage Vtemp2. In the embodiment of FIG. 10A, the resistor Rds3_adj is a voltage-controlled element (i.e., a voltage-controlled resistor) that responds to the sensing voltage Vtemp2. As the sensing voltage Vtemp2 increases, the resistance value of the resistor Rds3_adj increases. The current outputted from the current source ITH3 does not vary with temperature. In other words, because the sensing voltage Vtemp2 increases as the temperature of the power semiconductor elements NM3 and NM4 increases, the resistance of the resistor Rds3_adj increases as the temperature of the power semiconductor elements NM3 and NM4 increases. In this way, the reference voltage Vds3_adj increases as the temperature of the power semiconductor elements NM3 and NM4 increases. The operation logic of the time delay circuit 160 is similar to the operation logic of the time delay circuit 120 of FIG. 4A, so a detailed operation of the time delay circuit 160 is not described herein.

According to the above description, the reference voltage Vds3_adj is related to the temperature of the power semiconductor elements NM3 and NM4. In detail, the reference voltage Vds3_adj increases as the temperature of the power semiconductor elements NM3 and NM4 increases and is controlled within a range of the SOA of the power semiconductor element NM2. In general, the range of the SOA of a power semiconductor element varies with the operating temperature and/or with variations in the process.

Therefore, in other embodiments of the present invention (e.g., the embodiment of FIG. 10B), the voltage converter 1 may be coupled to or include a memory that stores a lookup table. The memory may be disposed within the driving circuit 100, such as within the control logic circuit 220. The lookup table includes a plurality of preset sensing voltage values as indexes and further includes a plurality of preset reference voltage values as output values. The plurality of preset sensing voltages corresponds to different temperature values or temperature ranges of a power semiconductor element, and the plurality of preset reference voltages corresponds to different ranges of the SOA of the power semiconductor element.

Referring to FIG. 10B, in some embodiments, the time delay circuit 160 includes only the comparator CMP3 but does not include the current source ITH3 and the resistor Rds3_adj of the embodiment of FIG. 10A. The positive input terminal (+) of the comparator CMP3 receives the reference voltage Vds3_adj, and the negative input terminal (−) thereof receives the drain-source voltage VDS3. The voltage converter 1 (or the driving circuit 100 or the control logic circuit 220) searches or performs the aforementioned lookup table in the memory according to the sensing voltage Vtemp2 (corresponding to one preset sensing voltage value in the aforementioned lookup table) generated by the temperature sensor 162 to obtain a corresponding preset reference voltage value and to obtain a corresponding preset reference voltage value as the reference voltage Vds3_adj. The reference voltage Vds3_adj of FIG. 10B increases as the temperature of the power semiconductor elements NM3 and NM4 increases and further corresponds to a range of the SOA of the power semiconductor element NM4 at the temperature of the power semiconductor elements NM3 and NM4. The operation logic of the time delay circuit 160 of FIG. 10B is similar to the operation logic of the time delay circuit 120 of FIG. 4B, so a detailed operation of the time delay circuit 160 is not described herein. According to the embodiment of FIG. 10B, the time delay circuit 160 can dynamically adjust a time delay (i.e., a time period t6) between the time point at which the power semiconductor element NM4 is turned on and the time point at which the power semiconductor element NM3 is turned on in accordance with the temperature of the power semiconductor elements NM3 and NM4.

In the embodiment that FIG. 4B and FIG. 10B are simultaneously utilized, the voltage converter 1 may be coupled to or include a memory that stores a lookup table for obtaining the reference voltages Vds1_adj and Vds3_adj.

Figure 11B:
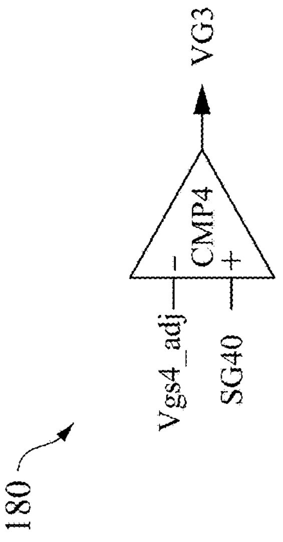
FIG. 11B is an exemplary circuit diagram of a time delay circuit according to some embodiments of the present invention.
Figure 11A:
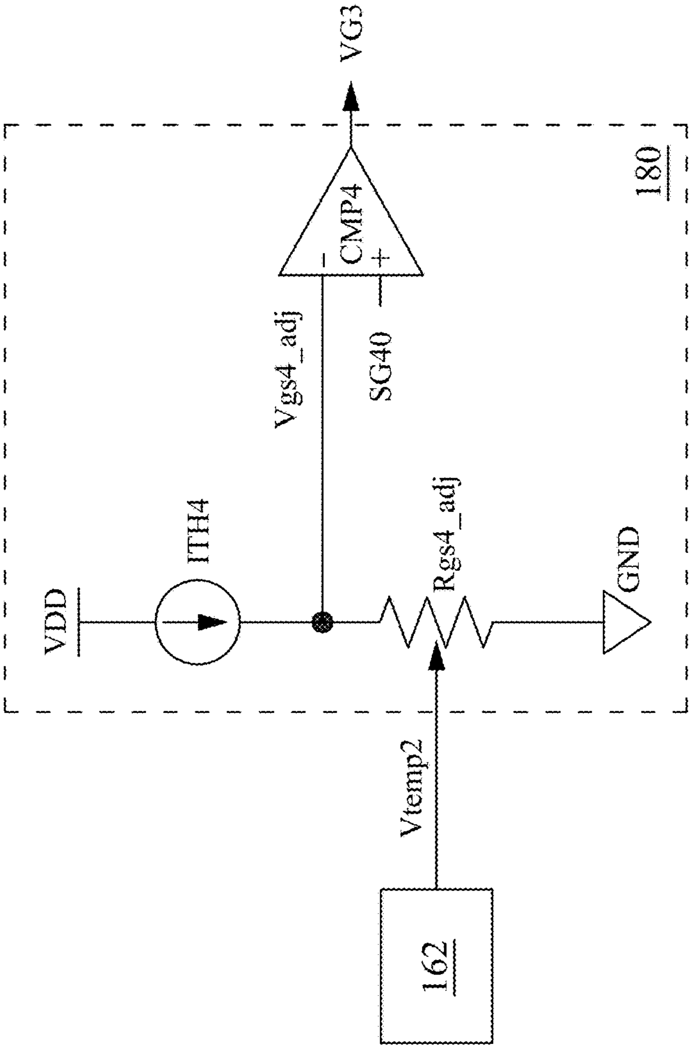
FIG. 11A is an exemplary circuit diagram of a temperature sensor and a time delay circuit according to some embodiments of the present invention.

FIG. 11A is an exemplary circuit diagram of a temperature sensor 162 and a time delay circuit 180 according to some embodiments of the present invention. As shown in FIG. 11A, the time delay circuit 180 receives a sensing voltage Vtemp2 from the temperature sensor 162, generates a reference voltage Vgs4_adj according to the sensing voltage Vtemp2, compares the reference voltage Vgs4_adj with the voltage level of the control signal SG40 to generate a comparison result, and outputs the voltage VG3 based on the comparison result.

In detail, as shown in FIG. 11A, the time delay circuit 180 includes a current source ITH4, a resistor Rgs4_adj, and a comparator CMP4. The current source ITH4 is coupled to the resistor Rgs4_adj in series between the system voltage VDD and the ground GND. A negative input terminal (−) of the comparator CMP4 is coupled to the node between the current source ITH4 and the resistor Rgs4_adj to receive the reference voltage Vgs4_adj, and a positive input terminal (+) thereof receives the reference voltage Vgs4_adj. The comparator CMP4 performs a comparison operation based on the voltage level of the control signal SG40 and the reference voltage Vgs4_adj. When the voltage level of the control signal SG40 is greater than the reference voltage Vgs4_adj, the voltage VG3, which is outputted or generated by the comparator CMP4 through its output terminal, is at a high voltage level. When the voltage level of the control signal SG40 is less than the reference voltage Vgs4_adj, the voltage VG3 is at a low voltage level.

As shown in FIG. 11A, the resistor Rgs4_adj receives the sensing voltage Vtemp2. In the embodiment of FIG. 11A, the resistor Rgs4_adj is a voltage-controlled element (i.e., a voltage-controlled resistor) that responds to the sensing voltage Vtemp2. As the sensing voltage Vtemp2 decreases, the resistance value of the resistor Rgs4_adj increases. In addition, the current outputted from the current source ITH4 does not vary with temperature. In other words, because the sensing voltage Vtemp2 decreases as the temperature of the power semiconductor elements NM3 and NM4 decreases, the resistance of the resistor Rgs4_adj increases as the temperature of the power semiconductor elements NM3 and NM4 decreases. In this way, the reference voltage Vgs4_adj increases as the temperature of the power semiconductor elements NM3 and NM4 decreases. The operation logic of the time delay circuit 180 is similar to the operation logic of the time delay circuit 140 of FIG. 6A, so a detailed operation of the time delay circuit 180 is not described herein.

According to the above description, the reference voltage Vgs4_adj is generated by the current source ITH4 and the resistor Rgs4_adj according to the sensing voltage Vtemp2, and is related to the temperature of the power semiconductor elements NM3 and NM4. In detail, the reference voltage Vgs4_adj increases as the temperature of the power semiconductor elements NM3 and NM4 decreases. In other embodiments, the reference voltage Vgs4_adj indicates a threshold voltage of the power semiconductor element NM4. Generally, the threshold voltage of the power semiconductor element varies with the operating temperature and/or with variations in the process.

In other embodiments of the present invention, the voltage converter 1 may be coupled to or include a memory that stores a lookup table. The memory may be disposed within the driving circuit 100, such as within the control logic circuit 220. The lookup table includes a plurality of preset sensing voltage values as indexes and further includes a plurality of preset reference voltage values as output values. The plurality of preset sensing voltages corresponds to different temperature values or temperature ranges of a power semiconductor element, and the plurality of preset reference voltages corresponds to different threshold voltages of the power semiconductor element.

Referring to FIG. 11B, in some embodiments, the time delay circuit 180 includes only the comparator CMP4 but does not include the current source ITH4 and the resistor Rgs4_adj of the embodiment of FIG. 11A. The positive input terminal (+) of the comparator CMP4 receives the control signal SG40 and the negative input terminal (−) thereof receives the reference voltage Vgs4_adj. The voltage converter 1 (or the driving circuit 100 or the control logic circuit 220) receives the reference voltage Vtemp2 based on the sensing voltage Vtemp2 (corresponding to a preset value in the above lookup table) generated by the temperature sensor 162. The voltage converter 1 (or the driving circuit 100 or the control logic circuit 220) searches or performs the aforementioned lookup table in the memory according to the sensing voltage Vtemp2 (corresponding to a preset sensing voltage value in the aforementioned lookup table) generated by the temperature sensor 162 to obtain a corresponding preset reference voltage value as the reference voltage Vgs4_adj. It can be known from the above description that, the reference voltage Vgs4_adj of FIG. 11B increases as the temperature of the power semiconductor elements NM3 and NM4 decreases and further corresponds to a threshold voltage of the power semiconductor element NM4 at the temperature of the power semiconductor elements NM3 and NM4. The operation logic of the time delay circuit 180 of FIG. 11B is similar to the operation logic of the time delay circuit 140 of FIG. 6B, so a detailed operation of the time delay circuit 180 is not described herein. According to the embodiment of FIG. 11B, the time delay circuit 180 can dynamically adjust a time delay (i.e., a time period t1) between the time point at which the power semiconductor element NM3 is turned off and the time point at which the power semiconductor element NM4 is turned off in accordance with the temperature of the power semiconductor elements NM3 and NM4.

In the embodiment that FIG. 6B and FIG. 11B are simultaneously utilized, the voltage converter 1 may be coupled to or include a memory that stores a lookup table for obtaining the reference voltages Vgs2_adj and Vgs4_adj.

In the embodiment that FIG. 4B, FIG. 6B, FIG. 10B, and FIG. 11B are simultaneously utilized, the voltage converter 1 may be coupled to or include a memory that stores two lookup tables, one of which is used for obtaining the reference voltages Vds1_adj and Vds3_adj and the other one of which is used for obtaining the reference voltages Vgs2_adj and Vgs4_adj. In the embodiment that FIG. 4B, FIG. 6B, FIG. 10B, and FIG. 11B are simultaneously utilized, the time periods t1, t3, t4, t6 can be shortened and the time delayers DL1 and DL2 of FIG. 3 can be omitted, thus improving the operation efficiency of the voltage converter 1. In the case of omitting the time delayers DL1 and DL2 of FIG. 3, an input terminal of the OR gate OR1 is directly coupled to an output terminal of the AND gate AND1, and an input terminal of the OR gate OR2 is directly coupled to an output terminal of the AND gate AND2.

Figure 12:
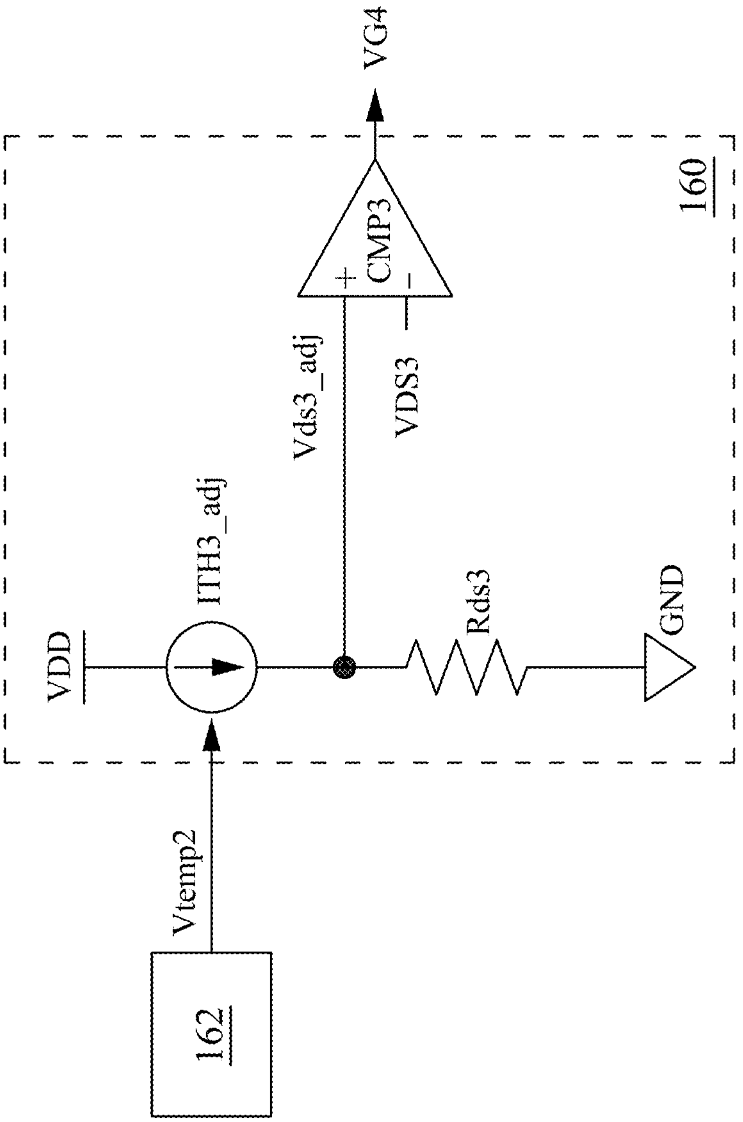
FIG. 12 is another exemplary circuit diagram of a time delay circuit according to some embodiments of the present invention.

FIG. 12 is another exemplary circuit diagram of the time delay circuit 160 according to some embodiments of the present invention. The time delay circuit 160 of FIG. 12 is similar to the time delay circuit 160 of FIG. 10A, except that the current source ITH3 and the resistor Rds3_adj of the time delay circuit 160 of FIG. 10A are replaced with the current source ITH3_adj and the resistor Rds3 in the time delay circuit 160 of FIG. 12. Specifically, the time delay circuit 160 of FIG. 12 has similar functions to the time delay circuit 160 of FIG. 10A, and therefore, the time delay circuit 160 in the embodiment shown in FIG. 1 can also be implemented by utilizing the time delay circuit 160 of FIG. 12.

In detail, as shown in FIG. 12, the current source ITH3_adj is coupled to the resistor Rds3 in series between the system voltage VDD and the ground GND, and receives a sensing voltage Vtemp2. In the embodiment of FIG. 12, the current source ITH3_adj is a voltage-controlled element (i.e., a voltage-controlled current source) that responds to the sensing voltage Vtemp2. As the sensing voltage Vtemp2 increases, the current of the current source ITH3_adj increases. The resistance of the resistor Rds3 does not vary with temperature. In other words, because the sensing voltage Vtemp2 increases as the temperature of the power semiconductor elements NM3 and NM4 increases, the current outputted from the current source ITH3_adj increases as the temperature of the power semiconductor elements NM3 and NM4 increases. In this way, the reference voltage Vds3_adj increases as the temperature of the power semiconductor elements NM3 and NM4 increases.

Figure 13:
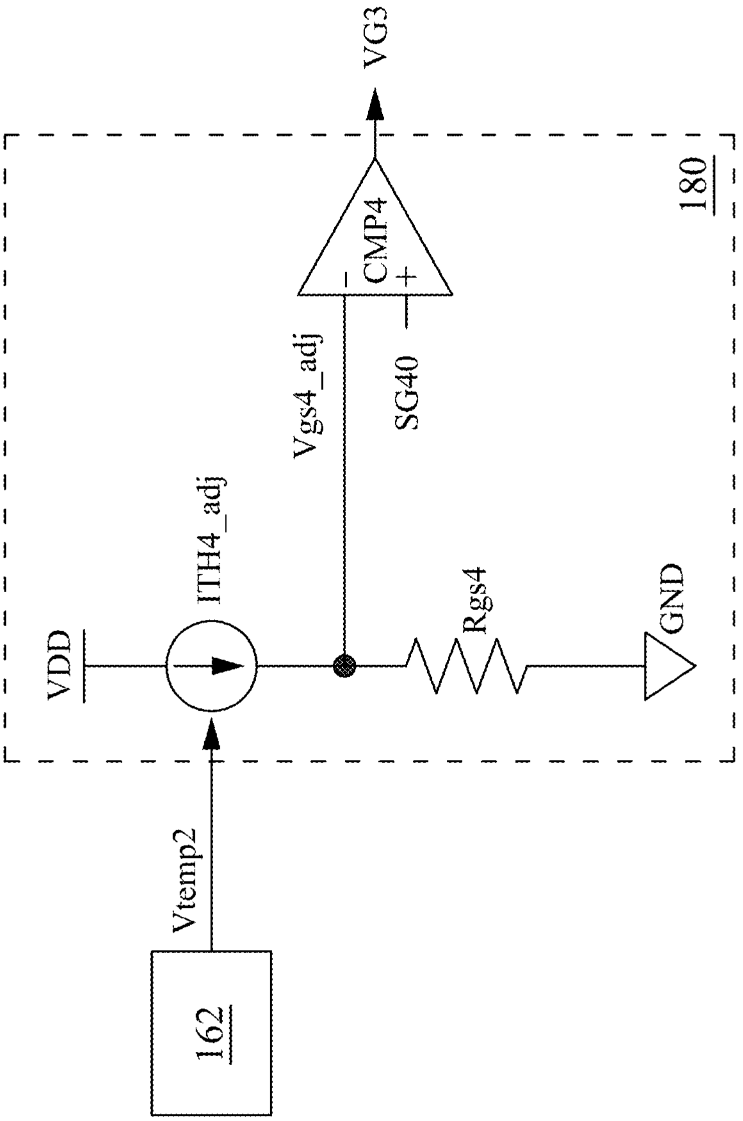
FIG. 13 is another exemplary circuit diagram of a time delay circuit according to some embodiments of the present invention.

FIG. 13 is another exemplary circuit diagram of a time delay circuit 180 according to some embodiments of the present invention. The time delay circuit 180 of FIG. 13 is similar to the time delay circuit 180 of FIG. 11A, except that the current source ITH4 and the resistor Rgs4_adj of the time delay circuit 180 of FIG. 11A are replaced with the current source ITH4_adj and the resistor Rgs4 of the time delay circuit 180 in FIG. 13. Specifically, the time delay circuit 180 of FIG. 13 has similar functions to the time delay circuit 180 of FIG. 11A. Therefore, the time delay circuit 180 in the embodiment shown in FIG. 1 can also be implemented by utilizing the time delay circuit 180 of FIG. 13.

In detail, as shown in FIG. 13, the current source ITH4_adj is coupled to the resistor Rgs4 in series between the system voltage VDD and the ground GND, and the current source ITH4_adj receives the sensing voltage Vtemp2. In the embodiment of FIG. 13, the current source ITH4_adj is a voltage-controlled element (i.e., a voltage-controlled current source) that responds to the sensing voltage Vtemp2. As the sensing voltage Vtemp2 decreases, the current of the current source ITH4_adj increases. The resistance of the resistor Rgs4 does not vary with temperature. In other words, because the sensing voltage Vtemp2 decreases as the temperature of the power semiconductor elements NM3 and NM4 decreases, the current outputted from the current source ITH4_adj increases as the temperature of the power semiconductor elements NM3 and NM4 decreases. In this way, the reference voltage Vgs4_adj increases as the temperature of the power semiconductor elements NM3 and NM4 decreases.

The detailed operation of the voltage converter 1 in various phases is described below with reference to FIGS. 1 to 4A, 6A, 10A, and 11A. Before the start point of the time period t1, the logic signals SG1 and SG2 are at a low voltage level. At the start point of the time period t1, the PWM signal SPWM is switched or changed from the low voltage level to the high voltage level, which indicates the intention to turn on the high-side portion (i.e., the power semiconductor elements NM1 and NM2) of the voltage converter 1. Therefore, the low-side portion (i.e., the power semiconductor elements NM3 and NM4) of the voltage converter 1 must be turned off first. In addition, because the range of the SOA of the power semiconductor element NM3 is larger than that of the power semiconductor element NM4, the time point at which the power semiconductor element NM3 is turned off must be later than the time point at which the power semiconductor element NM4 is turned off. As can be seen from FIG. 3, at this time, the inverted PWM signal SPWM received by the AND gate AND4 is switched or changed from the high voltage level to the low voltage level, so the logic signal SG4 output by the AND gate AND4 is switched or changed from the high voltage level to the low voltage level.

As described above, at the start point of the time period t1, the logic signal SG4 is switched or changed from the high voltage level to the low voltage level, which causes the control signal SG40 to gradually decrease from the high voltage level to the low voltage level during the time period t1. Thus, the control signal SG40 gradually turns off the power semiconductor element NM4. As the power semiconductor element NM4 is gradually turned off, the temperature of the power semiconductor elements NM3 and NM4 gradually decreases, which causes the reference voltage Vgs4_adj to gradually increase. At the end point of the time period t1, the control signal SG40 is less than the reference voltage Vgs4_adj, and the voltage VG3 output from the comparator CMP4 of the time delay circuit 180 of FIG. 11A is switched or changed from a high voltage level to a low voltage level. It can be known from FIG. 2 that, at the end point of the time period t1, the PWM signal SPWM is at a high voltage level. Therefore, through the operations by the AND gate AND2, the time delayer DL2, and the OR gate OR2, the logic signal SG3 is switched or changed from a high voltage level to a low voltage level, which causes the control signal SG30 to gradually decrease from a high voltage level to a low voltage level. Therefore, the control signal SG30 gradually turns off the power semiconductor element NM3.

As described above, at the start point of the time period t2 (i.e., the end point of the time period t1), the logic signal SG3 is switched or changed from a high voltage level to a low voltage level. During the time period t2, through the operation by the time delay circuit 140, the output voltage VG1 is at a low voltage level, which makes the OR gate OR1 dependent on the output signal from the AND gate AND1. Through the operation by the AND gate AND1 and the OR gate OR1 of FIG. 3, as the logic signal SG3 is switched or changed to a low voltage level, the logic signal SG1 is switched or changed from a low voltage level to a high voltage level at the end point of the time period t2 to turn on the power semiconductor element NM1. It should be noted that the time delayer DL1 is coupled between the AND gate AND1 and the OR gate OR1 (i.e., an input terminal of the OR gate OR1 is coupled to the output terminal of the AND gate AND1 via the time delayer DL1). Therefore, after the output signal of the AND gate AND1 is switched or changed from a low voltage level to a high voltage level because the logic signal SG3 is switched or changed from a high voltage level to a low voltage level, there is a time period t2 (i.e., a delay time of the time delayer DL1), and then the logic signal SG1 is switched or changed from a low voltage level to a high voltage level.

Next, during the time period t3, the drain-source voltage VDS1 of the power semiconductor element NM1 gradually decreases because the power semiconductor element NM1 is turned on, and the temperature of the power semiconductor elements NM1 and NM2 increases, which causes the reference voltage Vds1_adj to gradually increase until the end point (the time point T2) of the time period t3. When the drain-source voltage VDS1 of the power semiconductor element NM1 is smaller than the reference voltage Vds1_adj, a voltage VG2 outputted by the comparator CMP1 of the time delay circuit 120 of FIG. 4A is switched or changed from a low voltage level to a high voltage accordingly. Therefore, through the operation by the AND gate AND3 in FIG. 3, at the end point of the time period t3, the logic signal SG2 is switched or changed from a low voltage level to a high voltage level to turn on the power semiconductor element NM2.

Then, at the start point of time period t4, the PWM signal SPWM is switched or changed from a high voltage level to a low voltage level, which indicates an intention to turn on the low-side portion (i.e., the power semiconductor elements NM3 and NM4) of voltage converter 1. Therefore, the high-side portion (i.e., the power semiconductor elements NM1 and NM2) of the voltage converter 1 must be turned off first. In addition, because the range of the SOA of the power semiconductor element NM1 is larger than that of the power semiconductor element NM2, the time point at which the power semiconductor element NM1 is turned off must be later than the time point at which the power semiconductor element NM2 is turned off. As can be seen in FIG. 3, at this time, the PWM signal SPWM received by the AND gate AND3 is switched or changed from a high voltage level to a low voltage level, so that the logic signal SG2 outputted by the AND gate AND3 is switched or changed from a high voltage level to a low voltage level.

As described above, at the start point (i.e., the time point T3) of the time period t4, the logic signal SG2 is switched or changed from a high voltage level to a low voltage level, which causes the control signal SG20 to gradually decrease from a high voltage level to a low voltage level during the time period t4, so that the control signal SG20 gradually turns off the power semiconductor element NM2. As the power semiconductor element NM2 is gradually turned off, the temperature of the power semiconductor elements NM1 and NM2 gradually decreases, which causes the reference voltage Vgs2_adj to gradually increase. At the end point (i.e., the time point T4) of the time period t4, the control signal SG20 is less than the reference voltage Vgs2_adj, and the voltage VG1 outputted from the comparator CMP2 of the time delay circuit 140 of FIG. 6A is then switched or changed from a high voltage level to a low voltage level. It can be known from FIG. 2 that, at the end point of the time period t4, the PWM signal SPWM is at a low voltage level. Therefore, through the operation by the AND gate AND1 and the OR gate OR1 in FIG. 3, the logic signal SG1 is switched or changed from a high voltage level to a low voltage level, which causes the control signal SG10 to gradually decrease from a high voltage level to a low voltage level. Therefore, the control signal SG10 gradually turns off the power semiconductor element NM1.

As described above, at the start point (the time point T4) of the time period t5, the logic signal SG1 is switched or changed from a high voltage level to a low voltage level. During the time period t5, through the operation by the time delay circuit 180, the output voltage VG3 is at a low voltage level, which makes the OR gate OR2 dependent on the output signal from the AND gate AND2. Through the operation by the AND gate AND2 and the OR gate OR2 in FIG. 3, as the logic signal SG1 is switched or changed to a low voltage level, the logic signal SG3 is switched or changed from a low voltage level to a high voltage level at the end point of the time period t5, which turns on the power semiconductor element NM3. It should be noted that the time delayer DL2 is coupled between the AND gate AND2 and the OR gate OR2 (i.e., an input terminal of the OR gate OR2 is coupled to the output terminal of the AND gate AND2 via the time delayer DL2). Therefore, after the output signal of the AND gate AND2 is switched or changed from a low voltage level to a high voltage level because the logic signal SG1 is switched or changed from a high voltage level to a low voltage level, there is a time period t5 (i.e., a delay time of the time delayer DL2), and then the logic signal SG3 can be switched or changed from a low voltage level to a high voltage level.

Next, during the time period t6, the drain-source voltage VDS3 of the power semiconductor element NM3 gradually decreases because the power semiconductor element NM3 is turned on, and the temperature of the power semiconductor elements NM3 and NM4 increases, which causes the reference voltage Vds3_adj to gradually increase. At the end point of the time period t6, the drain-source voltage VDS3 of the power semiconductor element NM3 is less than the reference voltage Vds3_adj, and the voltage VG4 outputted from the comparator CMP3 of the time delay circuit 160 of FIG. 10A is switched or changed from a low voltage level to a high voltage. Therefore, through the operation by the AND gate AND4 of FIG. 3, at the end point of the time period t6, the logic signal SG4 is switched or changed from a low voltage level to a high voltage level to turn on the power semiconductor element NM4.

Figure 14:
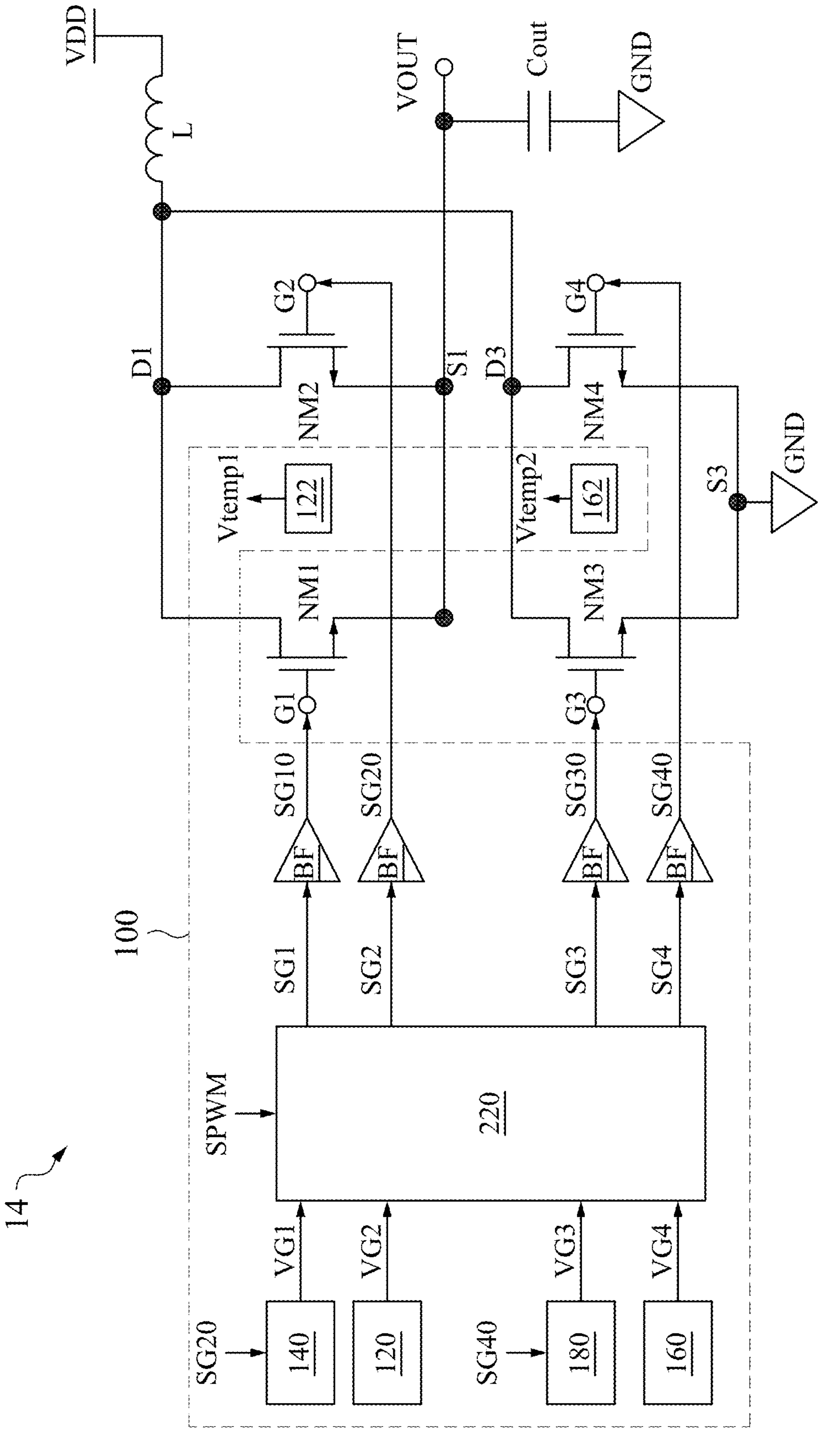
FIG. 14 is a circuit diagram of a voltage converter according to some embodiments of the present invention.

FIG. 14 is a circuit diagram of a voltage converter 14 according to some embodiments of the present invention. The voltage converter 14 is similar to the voltage converter 1 shown in FIG. 1, except that the voltage converter 14 is a boost converter.

Referring to FIG. 14, when the PWM signal SPWM is at the low voltage level, the voltage converter 14 turns on the low-side portion (i.e., the power semiconductor elements NM3 and NM4). At this time, the current from the system voltage VDD flows through the inductor L to store energy. When the PWM signal SPWM is at the high voltage level, the voltage converter 14 turns on the high-side portion (i.e., the power semiconductor elements NM1 and NM2), and the current flowing through the inductor L charges the output capacitor Cout via the high-side portion, so that the voltage converter 14 outputs the voltage VOUT.

The timing diagram of the signals of the voltage converter 14 is also as shown in FIG. 2, and the exemplary circuit diagram of the control logic circuit 220 of the voltage converter 14 is also as shown in FIG. 3. Therefore, the related operation process is not repeated herein.

According to the above-described embodiments, in the control method of the voltage converter of the present invention, a PWM signal SPWM is received by the control logic circuit 220, and the operations of the high-side portion and the low-side portion of the voltage converter 1 are controlled by using the PWM signal SPWM as a base signal. The control method of the present invention will be described below by an operation of controlling the high-side portion.

According to the control method of the present invention, the time delay circuit 140 performs a comparison operation to compare the voltage level of the control signal SG20 with the reference voltage Vgs2_adj to generate a corresponding comparison result, and the time delay circuit 140 generates the voltage VG1 based on the comparison result. In addition, the time delay circuit 120 performs another comparison operation to compare the drain-source voltage VDS1 of the power semiconductor element NM1 with the reference voltage Vds1_adj to generate a corresponding comparison result, and the time delay circuit 120 generates the voltage VG2 based on the comparison result. In some embodiments of the present invention, the reference voltages Vgs2_adj and Vds1_adj are both related to the temperature of the power semiconductor elements NM1 and NM2. By the control logic circuit 220, the logic signal SG1 is generated based on the voltage VG1 and the PWM signal SPWM, and the logic signal SG2 is generated based on the voltage VG2 and the PWM signal SPWM. The logic signals SG1 and SG2 are buffered by two buffers, respectively, so as to generate the control signals SG10 and SG20. The control signals SG10 and SG20 are supplied to the gate electrodes (i.e., the control electrodes) of the power semiconductor elements NM1 and NM2 respectively for controlling the turned-on/turned-off timing thereof.

The features of several embodiments are summarized above so that persons skilled in the art can better understand the status of the present invention. A person skilled in the art should realize that he or she can easily use the present invention as a basis to design or modify other processes and structures to achieve the same objectives and/or advantages as those embodiments presented herein. It should also be appreciated by those skilled in the art that these equivalent constructions do not depart from the spirit and scope of the present invention, and they can make a variety of changes, substitutions, and variations without departing from the spirit and scope of the present invention.

What is claimed is:

1. A driving circuit for generating a first control signal and a second control signal and providing the first and second control signals respectively to control electrodes of first and second power semiconductor elements that are coupled to a voltage converter in parallel, wherein a range of a safe operation area (SOA) of the first power semiconductor element is larger than a range of an SOA of the second power semiconductor element, and the driving circuit comprises:

a first time delay circuit configured to perform a first comparison operation to compare a voltage level of the second control signal with a first reference voltage to generate a first comparison result or compare a drain-source voltage of the first power semiconductor element with a second reference voltage to generate a second comparison result and configured to generate a first voltage according to the first or second comparison result, wherein the first and second reference voltages are related to a temperature of the first and second power semiconductor elements;

a control logic circuit coupled to the first time delay circuit and configured to generate a first logic signal according to the first voltage; and a first buffer coupled to the control logic circuit and configured to generate one of the first and second control signals according to the first logic signal.

2. The driving circuit of claim 1, wherein the first reference voltage increases as the temperature of the first and second power semiconductor elements decreases, and the second reference voltage increases as the temperature of the first and second power semiconductor elements increases.

3. The driving circuit of claim 1, wherein the first time delay circuit performs the first comparison operation to generate the first comparison result and generates the first voltage according to the first comparison result, and the first buffer generates the first control signal according to the first logic signal;

wherein the driving circuit further comprises:

a second time delay circuit configured to perform a second comparison operation to compare the drain-source voltage with the second reference voltage to generate the second comparison result and configured to generate a second voltage according to the second comparison result, wherein the control logic circuit is coupled to the second time delay circuit and configured to generate a second logic signal according to the second voltage; and a second buffer coupled to the control logic circuit and configured to generate the second control signal according to the second logic signal.

4. The driving circuit of claim 3, wherein the first time delay circuit comprises a first current source, a first resistor, and a first comparator, wherein the first current source is coupled to the first resistor in series, wherein a negative input terminal of the first comparator is coupled to a node between the first current source and the first resistor to receive the first reference voltage, and wherein a positive input terminal of the first comparator receives the second control signal, and the first comparator generates the first voltage from its output terminal based on the first comparison result.

5. The driving circuit of claim 4, wherein one of the first resistor and the first current source receives a sensing voltage and is a voltage-controlled element that responds to the sensing voltage, and the sensing voltage indicates the temperature of the first and second power semiconductor elements.

6. The driving circuit of claim 3, wherein the second time delay circuit comprises a second current source, a second resistor, and a second comparator, wherein the second current source is coupled to the second resistor in series, wherein a positive input terminal of the second comparator is coupled to a node between the second current source and the second resistor to receive the second reference voltage, and wherein a negative input terminal of the second comparator receives the drain-source voltage, and the second comparator generates the second voltage from its output terminal based on the second comparison result.

7. The driving circuit of claim 6, wherein one of the second resistor and the second current source receives a sensing voltage and is a voltage-controlled element that responds to the sensing voltage, and the sensing voltage indicates the temperature of the first and second power semiconductor elements.

8. The driving circuit of claim 3, wherein the first time delay circuit comprises a first comparator, wherein a negative input terminal of the first comparator receives the first reference voltage, and a positive input terminal of the first comparator receives the second control signal, wherein the first comparator generates the first voltage from its output terminal based on the first comparison result, and wherein the first reference voltage corresponds to a threshold voltage of the second power semiconductor element at the temperature of the first and second power semiconductor elements.

9. The driving circuit of claim 3, wherein the second time delay circuit comprises a second comparator, wherein a positive input terminal of the second comparator receives the second reference voltage, and a negative input terminal of the second comparator receives the drain-source voltage, wherein the second comparator generates the second voltage from its output terminal based on the second comparison result, wherein the second reference voltage corresponds to the range of the SOA of the second power semiconductor element at the temperature of the first and second power semiconductor elements.

10. A voltage converter, comprising:

a first power semiconductor element having a control electrode for receiving a first control signal;

a second power semiconductor element, coupled to the first power semiconductor element in parallel, having a control electrode for receiving a second control signal, wherein a range of an SOA of the first power semiconductor element is larger than a range of an SOA of the second power semiconductor element;

a first time delay circuit configured to perform a first comparison operation to compare a voltage level of the second control signal with a first reference voltage to generate a first comparison result or compare a first drain-source voltage of the first power semiconductor element with a second reference voltage to generate a second comparison result and configured to generate a first voltage according to the first or second comparison result, wherein the first and second reference voltages are related to a first temperature of the first and second power semiconductor elements;

a control logic circuit coupled to the first time delay circuit and configured to generate a first logic signal according to the first voltage and a pulse-width modulation (PWM) signal; and a first buffer coupled to the control logic circuit and configured to generate one of the first and second control signals according to the first logic signal.

11. The voltage converter of claim 10, wherein the first time delay circuit performs the first comparison operation to generate the first comparison result and generates the first voltage according to the first comparison result, and the first buffer generates the first control signal according to the first logic signal;

wherein the voltage converter further comprises:

a second time delay circuit configured to perform a second comparison operation to compare the first drain-source voltage with the second reference voltage to generate the second comparison result and configured to generate a second voltage according to the second comparison result, wherein the control logic circuit is coupled to the second time delay circuit and configured to generate a second logic signal according to the second voltage and the PWM signal; and a second buffer coupled to the control logic circuit and configured to generate the second control signal according to the second logic signal.

12. The voltage converter of claim 11, wherein the first time delay circuit comprises a first comparator, wherein a negative input terminal of the first comparator receives the second reference voltage, and a positive input terminal of the first comparator receives the second control signal, wherein the first comparator generates the first voltage from its output terminal based on the first comparison result, and the first reference voltage increases as the first temperature of the first and second power semiconductor elements decreases.

13. The voltage converter of claim 12, wherein in response to that the second power semiconductor element is turned off according to the second control signal, when the first comparison result indicates that the voltage level of the second control signal is less than the first reference voltage, the first comparator generates the first voltage with a first voltage level, and the first power semiconductor element is turned off according to the first voltage level.

14. The voltage converter of claim 11, wherein the second time delay circuit comprises a second comparator, wherein a positive input terminal of the second comparator receives the second reference voltage, and a negative input terminal of the second comparator receives the first drain-source voltage, wherein the second comparator generates the second voltage from its output terminal based on the second comparison result, and the second reference voltage increases as the first temperature of the first and second power semiconductor elements increases.

15. The voltage converter of claim 14, wherein in response to that the first power semiconductor element is turned on according to the first control signal, when the second comparison result indicates that the first drain-source voltage is less than the second reference voltage, the second comparator generates the second voltage with a second voltage level, and the second power semiconductor element is turned on according to the second voltage level.

16. The voltage converter of claim 11, further comprising:

a third power semiconductor element having a control electrode for receiving a third control signal;

a fourth power semiconductor element coupled to the third power semiconductor element in parallel and having a control electrode for receiving a fourth control signal, wherein a range of an SOA of the third power semiconductor element is larger than a range of an SOA of the fourth power semiconductor element, wherein the first and second power semiconductor elements form a high-side portion of the voltage converter, and the third and fourth power semiconductor elements form a low-side portion of the voltage converter;

a third time delay circuit configured to perform a third comparison operation to compare a voltage level of the fourth control signal with a third reference voltage to generate a third comparison result and configured to generate a third voltage according to the third comparison result;

a fourth time delay circuit configured to perform a fourth comparison operation to compare a second drain-source voltage of the third power semiconductor element with a fourth reference voltage to generate a fourth comparison result and configured to generate a fourth voltage according to the fourth comparison result, wherein the third and fourth reference voltages are related to a second temperature of the third and fourth power semiconductor elements, wherein the control logic circuit is coupled to the third and fourth time delay circuits and configured to generate a third logic signal according to the third voltage and the PWM signal and generate a fourth logic signal according to the fourth voltage and the PWM signal;

a third buffer coupled to the control logic circuit and configured to generate the third control signal according to the third logic signal; and a fourth buffer coupled to the control logic circuit and configured to generate the fourth control signal according to the fourth logic signal.

17. The voltage converter of claim 16, wherein the control logic circuit comprises:

a first AND gate configured to receive the PWM signal, an inverted signal of the third logic signal, and an inverted signal of the fourth logic signal;

a first OR gate coupled to an output terminal of the first AND gate and receiving the first voltage so as to output the first logic signal; and a second AND gate configured to receive the PWM signal and the second voltage so as to output the second logic signal.

18. The voltage converter of claim 17, wherein the control logic circuit further comprises:

a third AND gate configured to receive an inverted signal of the PWM signal, an inverted signal of the first logic signal, and an inverted signal of the second logic signal;

a second OR gate coupled to an output terminal of the third AND gate and receiving the third voltage so as to output the third logic signal; and a fourth AND gate configured to receive the inverted signal of the PWM signal and the fourth voltage so as to output the fourth logic signal.

19. A control method of a voltage converter, used to generate a first control signal and a second control signal and provide the first and second control signals respectively to control electrodes of first and second power semiconductor elements that are coupled to the voltage converter in parallel, wherein a range of an SOA of the first power semiconductor element is larger than a range of an SOA of the second power semiconductor element, and the control method of the voltage converter comprises:

receiving a pulse-width modulation (PWM) signal;

performing a first comparison operation to compare a voltage level of the second control signal with a first reference voltage to generate a first comparison result or compare a drain-source voltage of the first power semiconductor element with a second reference voltage to generate a second comparison result, wherein the first and second reference voltages are related to a temperature of the first and second power semiconductor elements;

generating a first voltage according to the first or second comparison result;

generating a first logic signal according to the first voltage; and buffering the first logic signal to generate one of the first and second control signals.

20. The control method of the voltage converter of claim 19, wherein in a case that the first comparison operation is performed to compare a voltage level of the second control signal and a first reference voltage to generate the first comparison result and the first control signal is also generated by buffering the first logic signal, the control method of the voltage converter further comprises:

performing a second comparison operation to compare the drain-source voltage of the first power semiconductor element with the second reference voltage to generate the second comparison result;

generating a second voltage according to the second comparison result;

generating a second logic signal according to the second voltage; and buffering the second logic signal to generate the second control signal.

* * * * *